United States Patent
Chiba et al.

(10) Patent No.: US 10,030,141 B2
(45) Date of Patent: Jul. 24, 2018

(54) RESIN COMPOSITION, PRE-PREG, LAMINATE, METAL FOIL-CLAD LAMINATE, AND PRINTED WIRING BOARD

(71) Applicant: MITSUBISHI GAS CHEMICAL COMPANY, INC., Tokyo (JP)

(72) Inventors: Tomo Chiba, Tokyo (JP); Hiroshi Takahashi, Tokyo (JP); Eisuke Shiga, Tokyo (JP); Takaaki Ogashiwa, Chiba-ken (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 442 days.

(21) Appl. No.: 14/435,574

(22) PCT Filed: Oct. 18, 2013

(86) PCT No.: PCT/JP2013/078388
§ 371 (c)(1),
(2) Date: Apr. 14, 2015

(87) PCT Pub. No.: WO2014/061811
PCT Pub. Date: Apr. 24, 2014

(65) Prior Publication Data
US 2015/0307708 A1    Oct. 29, 2015

(30) Foreign Application Priority Data

Oct. 19, 2012  (JP) .................................. 2012-231631

(51) Int. Cl.
| | |
|---|---|
| B32B 3/10 | (2006.01) |
| C08L 73/00 | (2006.01) |
| C08L 63/00 | (2006.01) |
| C08G 59/24 | (2006.01) |
| C08G 59/42 | (2006.01) |
| C08G 59/62 | (2006.01) |
| C08L 63/06 | (2006.01) |
| H05K 1/03 | (2006.01) |
| C08J 5/24 | (2006.01) |
| C08K 3/34 | (2006.01) |
| C08K 3/36 | (2006.01) |
| C08L 83/06 | (2006.01) |
| C08L 83/14 | (2006.01) |
| B32B 5/26 | (2006.01) |
| B32B 15/14 | (2006.01) |

(Continued)

(52) U.S. Cl.
CPC ............. *C08L 73/00* (2013.01); *B32B 5/26* (2013.01); *B32B 15/14* (2013.01); *C08G 59/24* (2013.01); *C08G 59/4246* (2013.01); *C08G 59/621* (2013.01); *C08J 5/24* (2013.01); *C08K 3/34* (2013.01); *C08K 3/36* (2013.01); *C08L 63/00* (2013.01); *C08L 63/06* (2013.01); *C08L 83/06* (2013.01); *C08L 83/14* (2013.01); *H05K 1/0353* (2013.01); *B32B 2260/021* (2013.01); *B32B 2260/046* (2013.01); *B32B 2262/101* (2013.01); *B32B 2307/306* (2013.01); *B32B 2307/3065* (2013.01); *B32B 2457/08* (2013.01); *C08G 77/18* (2013.01); *C08G 77/52* (2013.01); *C08J 2363/00* (2013.01); *C08J 2373/00* (2013.01); *C08J 2383/06* (2013.01); *C08J 2463/00* (2013.01); *C08J 2473/00* (2013.01); *C08L 2201/02* (2013.01); *C08L 2203/206* (2013.01); *C08L 2205/025* (2013.01); *H05K 2201/012* (2013.01); *H05K 2201/0162* (2013.01); *H05K 2201/0209* (2013.01); *H05K 2201/029* (2013.01); *H05K 2201/0275* (2013.01)

(58) Field of Classification Search
None
See application file for complete search history.

(56) References Cited

U.S. PATENT DOCUMENTS

2007/0196664 A1* 8/2007 Nikaido ............... C08G 59/621
                                                            428/413
2009/0017316 A1    1/2009 Kato et al.
(Continued)

FOREIGN PATENT DOCUMENTS

| JP | 3-66722 | 3/1991 |
|---|---|---|
| JP | 3-197529 | 8/1991 |

(Continued)

OTHER PUBLICATIONS

Search report from PCT/JP2013/078388, dated Jan. 21, 2014.
(Continued)

*Primary Examiner* — Christopher Polley
(74) *Attorney, Agent, or Firm* — Greenblum & Bernstein, P.L.C.

(57) ABSTRACT

An object of the present invention is to provide a resin composition that can attain cured products having high flame retardancy, high heat resistance, a small coefficient of thermal expansion, and high drilling processability, a prepreg having the resin composition, a laminate and a metal foil clad laminate having the prepreg, and a printed circuit board having the resin composition. A resin composition, having at least an epoxy silicone resin (A) prepared by reacting a linear polysiloxane (a) having a carboxyl group with a cyclic epoxy compound (b) having an epoxy group such that the epoxy group of the cyclic epoxy compound (b) is 2 to 10 equivalents based on the carboxyl group of the linear polysiloxane (a), a cyanic acid ester compound (B) and/or a phenol resin (C), and an inorganic filler (D).

38 Claims, No Drawings

(51) Int. Cl.
    *C08G 77/52*     (2006.01)
    *C08G 77/18*     (2006.01)

(56) References Cited

U.S. PATENT DOCUMENTS

| | | | |
|---|---|---|---|
| 2013/0045650 A1 | 2/2013 | Ogashiwa et al. | |
| 2013/0101863 A1* | 4/2013 | Mabuchi | C08G 59/5073 |
| | | | 428/457 |
| 2013/0136930 A1 | 5/2013 | Kato et al. | |
| 2013/0157061 A1* | 6/2013 | Sogame | B32B 27/38 |
| | | | 428/418 |

FOREIGN PATENT DOCUMENTS

| | | | | |
|---|---|---|---|---|
| JP | 5-295088 | 11/1993 | | |
| JP | 6-228415 | 8/1994 | | |
| JP | 8-48001 | 2/1996 | | |
| JP | 2000-158589 | 6/2000 | | |
| JP | 2003-105057 | 4/2003 | | |
| JP | 2003-246849 | 9/2003 | | |
| JP | 2003-252960 | 9/2003 | | |
| JP | 2006-143973 | 6/2006 | | |
| JP | 2008-266573 | 11/2008 | | |
| JP | 2009-35728 | 2/2009 | | |
| JP | 3173332 | 3/2011 | | |
| JP | WO 2011132674 A1 * | 10/2011 | | C08G 59/5073 |
| JP | WO 2011152402 A1 * | 12/2011 | | B32B 27/38 |
| TW | 201204760 | 2/2012 | | |
| WO | 2011/108524 | 9/2011 | | |
| WO | 2011/132674 | 10/2011 | | |
| WO | 2011-152402 | 12/2011 | | |
| WO | 2012/029690 | 3/2012 | | |

OTHER PUBLICATIONS

International Preliminary Examination Report in PCT/JP2013/078388 dated Apr. 21, 2015.
"Organic Silicone Synthetic Processes and Applications (2nd Edition)"; Chemical Industry Press, vol. 2; ISBN978-7-122-06616-9; Nov. 2009; p. 405.

* cited by examiner

RESIN COMPOSITION, PRE-PREG, LAMINATE, METAL FOIL-CLAD LAMINATE, AND PRINTED WIRING BOARD

TECHNICAL FIELD

The present invention relates to a resin composition, a prepreg, a laminate, a metal foil clad laminate, and a printed circuit board.

BACKGROUND ART

In recent years, higher integration, higher function, and highly dense packaging have been accelerated in semiconductors widely used in electronic apparatuses, communication apparatuses, and personal computers, and demands for properties of laminates for semiconductor plastic packages and high reliability thereof have been increased. Lead-free soldering is typically used because of increasing environmental concerns in particular. For this reason, laminates having high heat resistance suitable for a reflow step at high temperatures have been required.

A reduction in the coefficient of thermal expansion in the planar direction of the laminate has been strongly demanded in recent years for the following reason. When the difference in the coefficient of thermal expansion between a semiconductor element or a semiconductor plastic package and a laminate such as a printed circuit board for a semiconductor plastic package is great, a thermal impact applied to the laminate causes warpage in the laminate. This warpage causes connection deficits between the semiconductor element and the laminate or between the semiconductor plastic package and the laminate to be disposed.

Known methods of reducing the coefficient of thermal expansion in the planar direction of the laminate include a method comprising adding an inorganic filler to a resin composition.

Another known method comprises incorporating an organic filler having rubber elasticity into a varnish containing an epoxy resin (Patent Literatures 1 to 5).

Furthermore, a method comprising using silicone rubber as rubber elastic powder is known (Patent Literature 6).

Besides these, a method comprising incorporating a silicone resin, a siloxane modified resin, or an epoxy modified silicone resin into a varnish is known as another method of reducing the coefficient of thermal expansion.

CITATION LIST

Patent Literature

Patent Literature 1: Japanese Patent No. 3173332
Patent Literature 2: Japanese Patent Application Laid-Open No. H08-48001
Patent Literature 3: Japanese Patent Application Laid-Open No. 2000-158589
Patent Literature 4: Japanese Patent Application Laid-Open No. 2003-246849
Patent Literature 5: Japanese Patent Application Laid-Open No. 2006-143973
Patent Literature 6: Japanese Patent Application Laid-Open No. 2009-035728

SUMMARY OF INVENTION

Technical Problem

Unfortunately, only an increase in the amount of the inorganic filler to be filled will make the resulting resin composition hard and fragile. Such resin composition wears drill bits fast when prepregs formed by using the resin composition are drilled. Due to wear, the drill bits are readily damaged or broken or the accuracy of hole position is readily reduced. For this reason, drill bits are replaced more frequently, reducing productivity.

When an organic filler having rubber elasticity is used as in Cited Literature 1 to 5, use of a bromine-based flame retardant is often needed to maintain the flame retardancy of the laminate, resulting in high load on the environment. Furthermore, the silicone rubber used as rubber elastic powder undesirably reduces drilling processability.

When a silicone resin, a siloxane modified resin, or an epoxy modified silicone resin is only used as in Cited Literature 6, heat resistance is reduced.

The present invention has been made in consideration of such problems. An object of the present invention is to provide a resin composition that can attain cured products having high flame retardancy, high heat resistance, a small coefficient of thermal expansion, and high drilling processability, a prepreg comprising the resin composition, a laminate and a metal foil clad laminate comprising the prepreg, and a printed circuit board comprising the resin composition.

Solution to Problem

The present inventors have found that the problems above can be solved if a resin composition comprising a predetermined epoxy silicone resin, a predetermined cyanic acid ester compound and/or a predetermined phenol resin, and a predetermined inorganic filler is used, and have achieved the present invention. The present inventors have further found that the problems above can be also solved if a resin composition comprising a predetermined epoxy silicone resin, a predetermined BT resin, and a predetermined inorganic filler is used, and have achieved the present invention.

Namely, the present invention provides (1) to (26):

(1)

A resin composition, comprising at least an epoxy silicone resin (A) prepared by reacting a linear polysiloxane (a) having a carboxyl group with a cyclic epoxy compound (b) having an epoxy group such that the epoxy group of the cyclic epoxy compound (b) is 2 to 10 equivalents based on the carboxyl group of the linear polysiloxane (a), a cyanic acid ester compound (B) and/or a phenol resin (C), and an inorganic filler (D).

(2)

The resin composition according to the above (1), further comprising a halogen-free epoxy resin (E).

(3)

The resin composition according to the above (1) or (2), further comprising a maleimide compound (F).

(4)

The resin composition according to any one of the above (1) to (3), wherein the cyanic acid ester compound (B) comprises one or more selected from the group consisting of naphtholaralkyl-based cyanic acid ester compounds represented by formula (6):

(6)

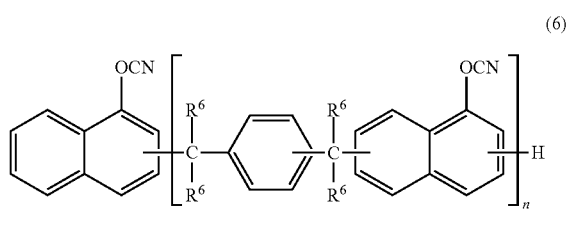

wherein $R^6$ each independently represents a hydrogen atom or a methyl group, and n represents an integer of 1 or more; and novolac-based cyanic acid ester compounds represented by formula (7):

(7)

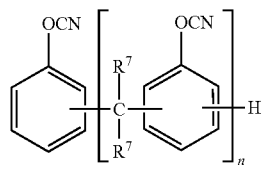

wherein $R^7$ each independently represents a hydrogen atom or a methyl group, and n represents an integer of 1 or more.

(5)

The resin composition according to any one of the above (1) to (4), wherein the phenol resin (C) comprises one or more selected from the group consisting of naphtholaralkyl-based phenol resins represented by formula (8):

(8)

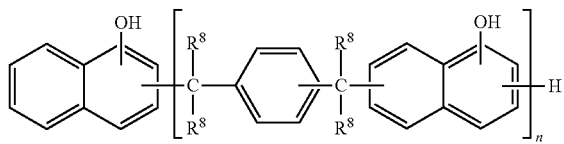

wherein $R^8$ each independently represents a hydrogen atom or a methyl group, and n represents an integer of 1 or more;

and biphenylaralkyl-based phenol resins represented by formula (9):

(9)

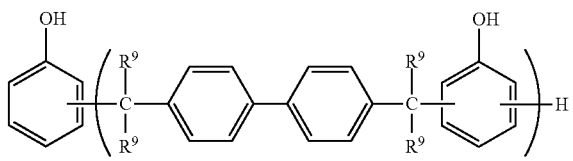

wherein $R^9$ each independently represents a hydrogen atom or a methyl group, and n represents an integer of 1 or more.

(6)

The resin composition according to any one of the above (3) to (5), wherein the maleimide compound (F) comprises a maleimide compound represented by formula (16):

(16)

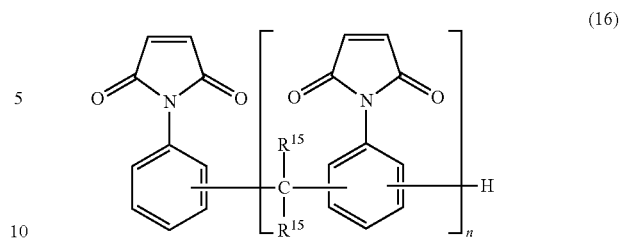

wherein $R^{15}$ each independently represents a hydrogen atom or a methyl group, and n represents an integer of 1 or more.

(7)

The resin composition according to any one of the above (3) to (6), wherein a content of the epoxy silicone resin (A) is 5 to 50 parts by mass based on 100 parts by mass of a total content of the epoxy silicone resin (A), the cyanic acid ester compound (B), the phenol resin (C), the halogen-free epoxy resin (E), and the maleimide compound (F).

(8)

The resin composition according to any one of the above (3) to (7), wherein a total content of the cyanic acid ester compound (B) and the phenol resin (C) is 10 to 50 parts by mass based on 100 parts by mass of the total content of the epoxy silicone resin (A), the cyanic acid ester compound (B), the phenol resin (C), the halogen-free epoxy resin (E), and the maleimide compound (F).

(9)

The resin composition according to any one of the above (3) to (8), wherein a content of the inorganic filler (D) is 50 to 400 parts by mass based on 100 parts by mass of the total content of the epoxy silicone resin (A), the cyanic acid ester compound (B), the phenol resin (C), the halogen-free epoxy resin (E), and the maleimide compound (F).

(10)

The resin composition according to any one of the above (3) to (9), wherein a content of the maleimide compound (F) is 3 to 50 parts by mass based on 100 parts by mass of the total content of the epoxy silicone resin (A), the cyanic acid ester compound (B), the phenol resin (C), the halogen-free epoxy resin (E), and the maleimide compound (F).

(11)

A resin composition, comprising at least an epoxy silicone resin (A) prepared by reacting a linear polysiloxane (a) having a carboxyl group with a cyclic epoxy compound (b) having an epoxy group such that the epoxy group of the cyclic epoxy compound (b) is 2 to 10 equivalents based on the carboxyl group of the linear polysiloxane (a), a BT resin (G) prepared by forming a cyanic acid ester compound (B) and a maleimide compound (F) into a prepolymer, and an inorganic filler (D).

(12)

The resin composition according to the above (11), further comprising a halogen-free epoxy resin (E).

(13)

The resin composition according to the above (11) or (12), wherein the cyanic acid ester compound (B) comprises one or more selected from the group consisting of naphtholaralkyl-based cyanic acid ester compounds represented by formula (6):

(6)

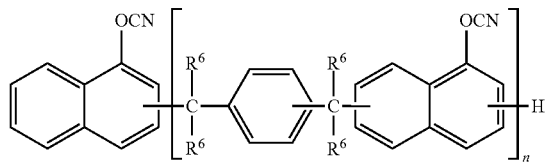

wherein R⁶ each independently represents a hydrogen atom or a methyl group, and n represents an integer of 1 or more; and novolac-based cyanic acid ester compounds represented by formula (7):

(7)

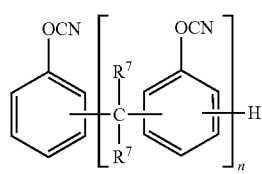

wherein R⁷ each independently represents a hydrogen atom or a methyl group, and n represents an integer of 1 or more.

(14)
The resin composition according to any one of the above (11) to (13), wherein the maleimide compound (F) comprises a maleimide compound represented by formula (16):

(16)

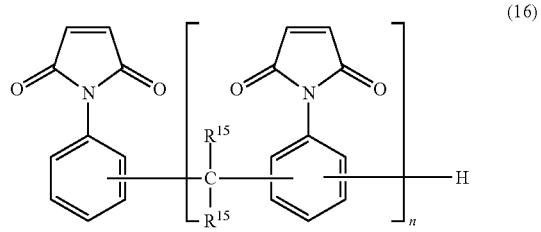

wherein R¹⁵ each independently represents a hydrogen atom or a methyl group, and n represents an integer of 1 or more.

(15)
The resin composition according to any one of the above (12) to (14), wherein a content of the epoxy silicone resin (A) is 5 to 50 parts by mass based on 100 parts by mass of a total content of the epoxy silicone resin (A), the BT resin (G), and the halogen-free epoxy resin (E).

(16)
The resin composition according to any one of the above (12) to (15), wherein a content of the BT resin (G) is 20 to 80 parts by mass based on 100 parts by mass of the total content of the epoxy silicone resin (A), the BT resin (G), and the halogen-free epoxy resin (E).

(17)
The resin composition according to any one of the above (12) to (16), wherein a content of the inorganic filler (D) is 50 to 400 parts by mass based on 100 parts by mass of the total content of the epoxy silicone resin (A), the BT resin (G), and the halogen-free epoxy resin (E).

(18)
The resin composition according to any one of the above (1) to (17), further comprising an imidazole compound (H), wherein the imidazole compound (H) comprises an imidazole compound represented by formula (17):

(17)

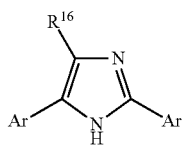

wherein Ar each independently represents a phenyl group, a naphthalene group, a biphenyl group, an anthracene group, or a hydroxyl group-modified group thereof, and R¹⁶ represents a hydrogen atom, an alkyl group, a hydroxyl group-modified group of an alkyl group, or an aryl group.

(19)
The resin composition according to the above (18), wherein the imidazole compound (H) comprises 2,4,5-triphenylimidazole.

(20)
The resin composition according to any one of the above (1) to (19), wherein the inorganic filler (D) comprises one or more selected from the group consisting of boehmite and silicas.

(21)
The resin composition according to any one of the above (2) to (10) and (12) to (20), wherein the halogen-free epoxy resin (E) is one or more selected from the group consisting of phenol phenyl aralkyl novolac-based epoxy resins, phenol biphenylaralkyl-based epoxy resins, naphtholaralkyl-based epoxy resins, anthraquinone-based epoxy resins, and polyoxynaphthylene-based epoxy resin.

(22)
A prepreg, comprising a base material, and the resin composition according to any one of the above (1) to (21) impregnated into or applied to the base material.

(23)
The prepreg according to the above (22), wherein the base material is one or more selected from the group consisting of an E-glass cloth, a T-glass cloth, an S-glass cloth, a Q-glass cloth, and organic fibers.

(24)
A laminate, comprising one or more layers comprising the prepreg according to the above (22) or (23).

(25)
A metal foil clad laminate, comprising the prepreg according to the above (22) or (23), and a metallic foil laminated on the prepreg.

(26)
A printed circuit board, comprising an insulating layer, and a conductive layer disposed on a surface of the insulating layer,
wherein the insulating layer comprises the resin composition according to any one of the above (1) to (21).

Advantageous Effects of Invention

The present invention can provide a resin composition that can attain cured products having high flame retardancy, high heat resistance, a small coefficient of thermal expansion, and high drilling processability, a prepreg comprising the resin composition, a laminate and a metal foil clad laminate comprising the prepreg, and a printed circuit board comprising the resin composition.

DESCRIPTION OF EMBODIMENTS

Embodiments according to the present invention will now be described. The embodiments described below are only illustrations for describing the present invention. The present invention will not be limited to these, and can be modified in various ways in the range of the gist.

[Resin Composition]

The resin composition according to one aspect of the present invention comprises at least an epoxy silicone resin (A) prepared by reacting a linear polysiloxane (a) having a carboxyl group with a cyclic epoxy compound (b) having an epoxy group such that the epoxy group of the cyclic epoxy compound (b) is 2 to 10 equivalents based on the carboxyl group of the linear polysiloxane (a), a cyanic acid ester compound (B) and/or a phenol resin (C), and an inorganic filler (D).

The resin composition according to another aspect of the present invention comprises at least an epoxy silicone resin (A) prepared by reacting a linear polysiloxane (a) having a carboxyl group with a cyclic epoxy compound (b) having an epoxy group such that the epoxy group of the cyclic epoxy compound (b) is 2 to 10 equivalents based on the carboxyl group of the linear polysiloxane (a), a BT resin (G) prepared by forming a cyanic acid ester compound (B) and a maleimide compound (F) into a prepolymer, and an inorganic filler (D).

The components in the respective aspects will now be described.

[Epoxy Silicone Resin (A)]

The resin composition according to the present embodiment comprises an epoxy silicone resin (A). The epoxy silicone resin (A) is prepared by reacting a linear polysiloxane (a) having a carboxyl group with a cyclic epoxy compound (b) having an epoxy group such that the epoxy group of the cyclic epoxy compound (b) is 2 to 10 equivalents based on the carboxyl group of the linear polysiloxane (a). Such an epoxy silicone resin (A) contained in the resin composition reduces the coefficient of thermal expansion of a cured product prepared with the resin composition more significantly, and also enhances the heat resistance thereof. The epoxy silicone resin (A) used in combination with another component more significantly enhances the flame retardancy, the heat resistance, and the drilling processability of the resulting cured product and more significantly reduces the coefficient of thermal expansion thereof.

The silicone resin not having an epoxy group has inferior affinity with other resins, and reduces molding properties and heat resistance. The silicone resin comprising a cyclic epoxy compound not bonded through a hemiester group has a low degree of cure to reduce heat resistance.

(Linear Polysiloxane (a) Having a Carboxyl Group)

The linear polysiloxane (a) can be any linear polysiloxane having a carboxyl group. The linear polysiloxane (a) is preferably a linear polysiloxane having carboxyl groups at least at both terminals. The carboxyl group is more preferably a hemiester group. Examples of the hemiester group include a group represented by the following formula:

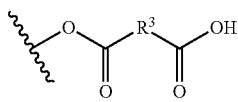

wherein $R^3$ represents a divalent linking group having 2 to 20 carbon atoms and optionally having a cyclic structure.

In the above formula, examples of such a divalent substituent for $R^3$ include, but should not be limited to, aliphatic groups such as an ethylene group and a vinylene group; alicyclic groups such as a cyclohexylene group, a methyl cyclohexylene group, a norbornylene group, and a methyl norbornylene group; and aromatic groups such as a phenylene group. Among these, a cyclohexylene group and a methyl cyclohexylene group are preferable for $R^3$ because of availability and the physical properties of the resulting cured product.

The linear polysiloxane (a) having a carboxyl group can be prepared by any method without limitation. Examples thereof include a method of reacting a linear polysiloxane having an alcoholic hydroxyl group with an acid anhydride. Examples of the linear polysiloxane having an alcoholic hydroxyl group include, but should not be limited to, a linear polysiloxane represented by formula (1) having alcoholic hydroxyl groups at both terminals. The linear polysiloxane having carboxyl groups at both terminals can attain a linear polysiloxane (a) having carboxyl groups at both terminals.

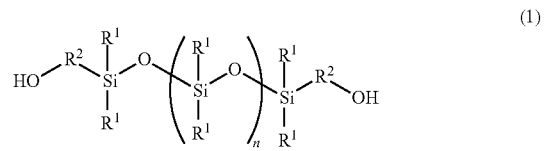

(1)

In formula (1), $R^1$ each independently represents a methyl group or a phenyl group. $R^1$ is preferably a methyl group because of availability and the physical properties of the resulting cured product;

$R^2$ each independently represents a divalent hydrocarbon group having 2 to 20 carbon atoms and optionally having an ether bonding oxygen atom in the group. Examples of such a divalent hydrocarbon group include, but should not be limited to, an ethylene group, a propylene group, a butylene group, a hexylene group, a decylene group, a dodecylene group, or a divalent group represented by formula (2). Among these, $R^2$ is preferably an alkylene group having 2 to 12 carbon atoms (more preferably a propylene group) or a divalent group represented by formula (2) because of physical properties of the cured product and availability:

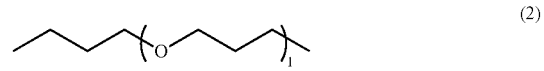

(2)

wherein l represents an integer of 1 to 3.

Furthermore, n is an integer of 0 to 100, preferably 0 to 50, still more preferably 0 to 30. At n of 100 or less, the flame retardancy, the heat resistance, and the drilling processability of the resulting cured product are enhanced more significantly and the coefficient of thermal expansion thereof is reduced more significantly. The linear polysiloxane represented by formula (1) having alcoholic hydroxyl groups at both terminals may be a resin having molecular weight distribution. At this time, n represents an average (number average) repetition number.

These linear polysiloxanes having alcoholic hydroxyl groups at both terminals may be used singly or in any combinations.

The acid anhydride can be any acid anhydride, and known compounds can be used. Suitable examples thereof include a cyclic acid anhydride represented by formula (3):

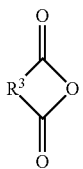
(3)

wherein R³ represents a divalent linking group having 2 to 20 carbon atoms and optionally having a cyclic structure. Examples of such a divalent linking group include, but should not be limited to, aliphatic groups such as an ethylene group and a vinylene group; alicyclic groups such as a cyclohexylene group, a methyl cyclohexylene group, a norbornylene group, and a methyl norbornylene group; and aromatic groups such as a phenylene group. R³ is preferably a cyclohexylene group and a methyl cyclohexylene group because of availability and the physical properties of the cured product.

Examples of the cyclic acid anhydride represented by formula (3) include, but should not be limited to, succinic anhydride, maleic anhydride, phthalic anhydride, hexahydrophthalic anhydride, methylated hexahydrophthalic anhydride, nasic anhydride, hydrogenated nasic anhydride, trimellitic anhydride, or pyromellitic anhydride.

These acid anhydrides may be used singly or in any combinations.

The linear polysiloxane (a) having a carboxyl group may be a reaction product (hemiester) of a linear polysiloxane having an alcoholic hydroxyl group with an acid anhydride and a dihydric alcohol. In this case, the linear polysiloxane (a) having a carboxyl group can be prepared by reacting the linear polysiloxane having an alcoholic hydroxyl group with an acid anhydride in the presence of a dihydric alcohol. Examples of the specific structure include a linear polysiloxane structure bonded to a hemiester group through a structure derived from a dihydric alcohol, which is represented by the following formula:

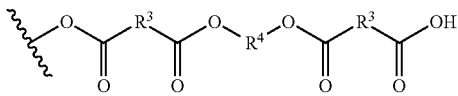

wherein R³ each independently represents a divalent linking group having 2 to 20 carbon atoms and optionally having a cyclic structure; R⁴ represents a divalent hydrocarbon group having 2 to 100 carbon atoms, preferably 2 to 20 carbon atoms.

Examples of dihydric alcohol that can be used here include, but should not be limited to, a dihydric alcohol represented by formula (4):

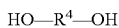
(4)

wherein R⁴ represents a divalent hydrocarbon group having 2 to 100 carbon atoms, preferably 2 to 20 carbon atoms, and may have a ring structure, ether bond, carbonyl bond, ester bond, amide bond, sulfone bond, or sulfide bond in the hydrocarbon chain. Especially, the terminal group in the hydrocarbon group to which an OH group bonds is preferably an aliphatic carbon group or an alicyclic carbon group such as methylene or methine.

Examples of such a dihydric alcohol include, but should not be limited to, linear alcohols having two functional groups at both terminals such as ethylene glycol, diethylene glycol, triethylene glycol, polyethylene glycol, propylene glycol, 1,4-butanediol, 1,5-pentanediol, 1,6-hexanediol, and 1,9-nonanediol; cycloaliphatic alcohols having two functional groups at both terminals such as 1,4-cyclohexanediol, 1,4-cyclohexanedimethanol, hydrogenated bisphenol A, hydrogenated bisphenol F, 4,4'-bicyclohexanol, 4,4'-bicyclohexanedimethanol, dihydroxydecalin, dihydroxymethyl decalin, and Spiro glycol; ester-group containing alcohols having two functional groups at both terminals such as polycaprolactonediol; amide group-containing alcohols having two functional groups at both terminals such as N-methyl-N',N''-dihydroxyethyl isocyanurate; and aromatic group-containing alcohols having two functional groups at both terminals such as bisphenols having ethylene oxide added thereto, such as bisphenol A, bisphenol F, bisphenol S, and dihydroxybenzophenone. Among these, linear alcohols having two functional groups at both terminals and cycloaliphatic alcohols having two functional groups at both terminals are preferable. Linear alkylene alcohols having two functional groups at both terminals and having 2 to 14 carbon atoms and cycloaliphatic alcohols having two functional groups at both terminals and having 3 to 14 carbon atoms are more preferable. Hydrogenated bisphenol A or 1,6-hexanediol is still more preferable. Such dihydric alcohols more significantly enhance the flame retardancy, the heat resistance, and the drilling processability of the resulting cured product, and more significantly reduces the coefficient of thermal expansion thereof. Such dihydric alcohols are readily available.

These dihydric alcohols may be used singly or in any combinations.

The molar ratio of the amount of the linear polysiloxane having an alcoholic hydroxyl group to the amount of the dihydric alcohol is not particularly limited, but preferably 0.1 to 5, more preferably 0.5 to 2. At a molar ratio of 5 or less, the proportion of the linear polysiloxane structure in the linear polysiloxane (a) is relatively small to more significantly suppress phase separation of the epoxy silicone resin (A) and other components and attain higher transparency. At a molar ratio of 0.1 or more, the proportion of the linear polysiloxane structure in the linear polysiloxane (a) is relatively high to reduce the brittleness of the resulting cured product and suppress coloring in a long-term heat resistance test. If the molar ratio of the amount of the linear polysiloxane having an alcoholic hydroxyl group to be used to the amount of the dihydric alcohol to be used is within the range above, the miscibility of the resin composition is enhanced to more significantly enhance the molding properties, the flame retardancy, the heat resistance, and drilling processability of the resulting cured product and more significantly reduce the coefficient of thermal expansion thereof.

The amount of the acid anhydride to be used is preferably 0.01 to 2 equivalents based on 1 equivalent of the total of alcoholic hydroxyl groups in the linear polysiloxane having an alcoholic hydroxyl group and hydroxyl groups in a dihydric alcohol as an optional component. A component having an alcoholic hydroxyl group may be excessively used for control of the curing rate of a resulting thermosetting resin and the crosslinking density thereof.

The linear polysiloxane (a) having a carboxyl group is prepared by a reaction of the linear polysiloxane having an alcoholic hydroxyl group, the acid anhydride, and a dihydric alcohol optionally used. The linear polysiloxane (a) has a hemiester group comprising an ester group generated by a reaction of the acid anhydride with the alcoholic hydroxyl group and a free carboxy group generated from the acid anhydride. When a theoretical amount of an alcohol mixture and that of the acid anhydride are used, the linear polysiloxane (a) having a carboxyl group is selectively generated. When a divalent alcohol mixture is excessively used, a mixture containing the linear polysiloxane (a) having a carboxyl group and alcohol is generated. The mixture containing the linear polysiloxane (a) having a carboxyl group and the alcohol mixture can be fed to the subsequent reaction without separation.

The reaction to prepare the linear polysiloxane (a) having a carboxyl group can be performed at any reaction temperature. The reaction temperature is generally 80 to 200° C., preferably 100 to 150° C. A reaction temperature of 80° C. or more shortens the reaction time. A reaction temperature of 200° C. or less can more significantly suppress side reactions such as a polymerization reaction and a decomposition reaction. The reaction is performed until the acid anhydride in the reaction system is consumed.

The reaction to prepare the linear polysiloxane (a) having a carboxyl group can also be performed in the absence of a solvent. Alternatively, a solvent not involved in the reaction may be used to increase stirring efficiency. Examples of the solvent not involved in the reaction include, but should not be limited to, aromatic hydrocarbon compounds such as toluene, xylene, and cumene; linear hydrocarbon compounds such as undecane and dodecane; and ketone-based compounds such as methyl isobutyl keton, cyclopentanone, and cyclohexanone.

(Cyclic Epoxy Resin (b))

Examples of the cyclic epoxy resin (b) used in the reaction above include, but should not be limited to, alicyclic epoxy resins and heterocyclic epoxy resins. The cyclic epoxy resin (b) is preferably a liquid at room temperature. The cyclic epoxy resin (b) has preferably 1 or more epoxy groups, more preferably 2 or more epoxy groups, still more preferably 2 epoxy groups. The cyclic epoxy resin (b) has preferably 10 or less epoxy groups.

The alicyclic epoxy resin can be any known alicyclic compound having an epoxy group. Specifically, those compounds described in known literature and documents such as "Sosetsu: Epokisi Jusi (Review of epoxy resin)" (published and edited by The Japan Society of Epoxy Resin Technology, 2003) can be suitably used. Typical examples of alicyclic epoxy resins include alicyclic epoxy resins represented by formula (5) (specifically, 3,4-epoxycyclohexylmethyl-3', 4'-epoxycyclohexanecarboxylate (trade name: Celloxide (registered trademark) 2021, Celloxide (registered trademark) 2021A, and Celloxide (registered trademark) 2021P (available from Daicel Corporation); ERL4221, ERL4221D, and ERL4221E (available from Dow Chemical Japan Limited); SEJ-01R (available from NIPPON KAYAKU Co., Ltd.)); bis(3,4-epoxycyclohexylmethyl) adipate (trade name: ERL4299 (available from Dow Chemical Japan Limited); EXA7015 (available from DIC Corporation); Celloxide (registered trademark) 2081 (available from Daicel Corporation); EPIKOTE YX8000 (available from Mitsubishi Chemical Corporation), EPIKOTE YX8034 (available from Mitsubishi Chemical Corporation); EPIKOTE YL7170 (available from Mitsubishi Chemical Corporation); Epolead GT-301, Epolead GT-401, Celloxide 3000, and EHPE3150 (available from Daicel Corporation); and 1-epoxyethyl-3,4-epoxycyclohexane, and limonene diepoxide. Among these, an alicyclic epoxy resin represented by formula (5) is preferable. Such an alicyclic epoxy resin attains higher heat resistance. These alicyclic epoxy resins may be used singly or in any combinations.

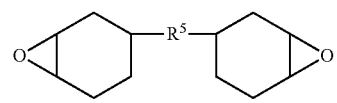

(5)

wherein $R^5$ represents a single bond or a divalent hydrocarbon group having 1 to 20 carbon atoms and optionally having an ester bonding oxygen atom.

Examples of the heterocyclic epoxy resin include, but should not be limited to, cyclic epoxy resins having an isocyanuric ring such as triglycidyl isocyanurate.

(Method of Preparing Epoxy Silicone Resin (A))

The epoxy silicone resin (A) can be prepared by reacting the linear polysiloxane (a) with the cyclic epoxy resin (b) such that the epoxy group of the cyclic epoxy resin (b) is 2 to 10 equivalents based on the carboxyl group in the hemiester group of the linear polysiloxane (a). Here, the equivalent of the epoxy group to that of the carboxyl group is 2 to 10 equivalents, preferably 3 to 9 equivalents, more preferably 4 to 8 equivalents. If the equivalent of the epoxy group to that of the carboxyl group is within this range, gelation of the epoxy silicone resin (A) is prevented more significantly, the brittleness of the cured product is reduced more significantly, and coloring in a long-term heat resistance test is prevented more significantly.

In the reaction of the linear polysiloxane (a) with the cyclic epoxy resin (b), the carboxyl group of the linear polysiloxane (a) is reacted with the epoxy group of the cyclic epoxy resin (b) to generate ester bond and a hydroxyl group. Furthermore, the epoxy group of an excessive cyclic epoxy resin (b) can be reacted with the generated hydroxyl group to generate ether bond and a hydroxyl group.

The reaction product of the linear polysiloxane (a) having an alcoholic hydroxyl group and the cyclic epoxy resin (b) is usually a mixture containing the epoxy silicone resin (A) and the cyclic epoxy resin (b). The epoxy silicone resin (A) and the cyclic epoxy resin (b) contained in the reaction product may be separated from the reaction product, or the reaction product may be used as a mixture.

The linear polysiloxane (a) having an alcoholic hydroxyl group can be reacted with the cyclic epoxy resin (b) under any general reaction condition on the reaction of a carboxyl group with an epoxy group. Persons skilled in the art can perform the reaction in preferable forms. For example, the reaction temperature is generally 50 to 230° C., preferably 70 to 170° C. A reaction temperature of 50° C. or more shortens the reaction time. A reaction temperature of 230° C. or less can more significantly suppress the decomposition of the resin or side reactions. In this reaction, a catalyst, an antioxidant, and a solvent may be optionally used.

The epoxy equivalent of the epoxy silicone resin (A) is not limited in particular. The epoxy equivalent is preferably 50 to 1600 g/eq., more preferably 150 to 800 g/eq. from the viewpoint of handling properties. The epoxy equivalent can be measured by the method described in Examples.

The number average molecular weight of the epoxy silicone resin (A) is not limited in particular. The number average molecular weight is preferably 100 to 100,000, more preferably 100 to 10,000 from the viewpoint of handling properties, glass transition temperature, and curing properties. The number average molecular weight can be determined with a gel permeation chromatography according to a standard method.

The viscosity at 25° C. of the epoxy silicone resin (A) is not limited in particular. The viscosity is preferably 5 to 1,000 mm²/S, more preferably 5 to 600 mm²/S from the viewpoint of handling properties. The viscosity at 25° C. can be measured by the method described in Examples.

In the resin composition according to one aspect of the present invention, the content of the epoxy silicone resin (A) is preferably 5 to 50 parts by mass, more preferably 10 to 40 parts by mass, still more preferably 15 to 35 parts by mass based on 100 parts by mass of the total content of the component (A), the component (B), the component (C), and optional components, i.e., a halogen-free epoxy resin (E) and a maleimide compound (F).

In the resin composition according to another aspect of the present invention, the content of the epoxy silicone resin (A) is preferably 5 to 50 parts by mass, more preferably 10 to 40 parts by mass, still more preferably 15 to 35 parts by mass based on 100 parts by mass of the total content of the component (A), the component (G), and an optional component, i.e., the halogen-free epoxy resin (E).

At a content of the epoxy silicone resin (A) within this range, a cured product having an improved glass transition temperature, higher heat resistance, and a lower coefficient of thermal expansion can be attained.

[Cyanic Acid Ester Compound (B)]

A cyanic acid ester compound (B) contained in the resin composition enhances the curing properties of the resin composition more significantly, and enhances the resistance against chemicals and the adhesiveness of the resulting cured product more significantly. Examples of the cyanic acid ester compound (B) include, but should not be limited to, naphtholaralkyl-based cyanic acid esters represented by formula (6), novolac-based cyanic acid esters represented by formula (7), biphenylaralkyl-based cyanic acid ester, bis(3, 5-dimethyl-4-cyanophenyl)methane, bis(4-cyanatophenyl)methane, 1,3-dicyanatobenzene, 1,4-dicyanatobenzene, 1,3,5-tricyanatobenzene, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl)ether, bis(4-cyanatophenyl)thioether, bis(4-cyanatophenyl)sulfone, and 2,2'-bis(4-cyanatophenyl)propane; and prepolymers of these cyanic acid ester compounds.

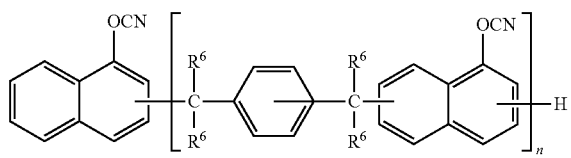

(6)

wherein R⁶ each independently represents a hydrogen atom or a methyl group; among these, a hydrogen atom is preferable; n represents an integer of 1 or more; the upper limit value of n is generally 10, preferably 6.

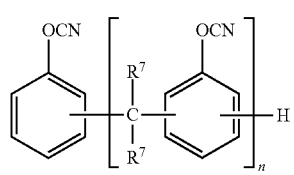

(7)

wherein $R^7$ each independently represents a hydrogen atom or a methyl group; among these, a hydrogen atom is preferable; n represents an integer of 1 or more; the upper limit value of n is generally 10, preferably 7.

These cyanic acid ester compounds (B) may be used singly or in combinations.

Among these, the cyanic acid ester compound (B) preferably comprises one or more selected from the group consisting of the naphtholaralkyl-based cyanic acid esters represented by formula (6), the novolac-based cyanic acid esters represented by formula (7), and biphenylaralkyl-based cyanic acid esters, more preferably comprises one or more selected from the group consisting of the naphtholaralkyl-based cyanic acid esters represented by formula (6) and the novolac-based cyanic acid esters represented by formula (7). Such a cyanic acid ester compound (B) attains a cured product having higher flame retardancy, higher curing properties, and a lower coefficient of thermal expansion.

These cyanic acid ester compounds can be prepared by any method, and a method known as a method of synthesizing cyanic acid ester can be used. Examples of the known method include, but should not be limited to, a method of reacting a phenol resin with cyanogen halide in an inactive organic solvent in the presence of a basic compound; and a method of forming a salt of a phenol resin and a basic compound in a solution containing water, and subjecting the resulting salt and cyanogen halide to a two-phase interfacial reaction.

Examples of the phenol resin used as a raw material for these cyanic acid ester compounds include, but should not be limited to, naphtholaralkyl-based phenol resins represented by formula (8), novolac-based phenol resins, and biphenylaralkyl-based phenol resins.

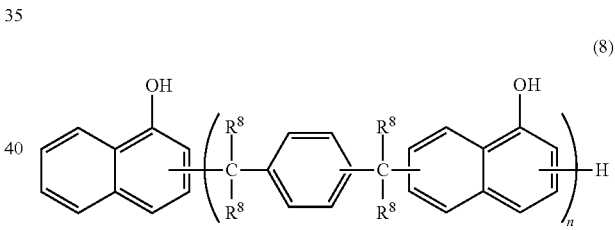

(8)

(wherein $R^8$ each independently represents a hydrogen atom or a methyl group; among these, a hydrogen atom is preferable; n represents an integer of 1 or more; the upper limit value of n is generally 10, preferably 6).

The naphtholaralkyl-based phenol resin represented by formula (8) can be prepared by condensation of a naphtholaralkyl resin and cyanic acid. Here, examples of the naphtholaralkyl-based phenol resin include, but should not be limited to, those prepared by a reaction of naphthols such as α-naphthol and β-naphthol with benzenes such as p-xylylene glycol, α,α'-dimethoxy-p-xylene, and 1,4-di(2-hydroxy-2-propyl)benzene. The naphtholaralkyl-based cyanic acid ester compound can be selected from those prepared by condensation of the naphtholaralkyl resin prepared as above and cyanic acid.

The ratio (CN/Ep) of the number of cyanate groups in the cyanic acid ester compound (B) to the total number of epoxy groups of compounds having epoxy groups in the resin composition is not limited in particular, preferably 0.7 to 2.5, more preferably 0.8 to 2.0, still more preferably 0.85 to 1.8. At a ratio (CN/Ep) within this range, the resulting cured product has higher heat resistance and higher flame retardancy and lower water absorption.

[Phenol Resin (C)]

The phenol resin (C) contained in the resin composition enhances the curing properties of the resin composition and the heat resistance of the cured product more significantly.

Known phenol resins can be properly used as the phenol resin (C) without limitation. Examples thereof include, but should not be limited to, resins having two or more phenolic hydroxyl groups in one molecule. Examples of the phenol resin (C) include, but should not be limited to, cresol novolac-based phenol resins, phenol novolac resins, alkyl phenol novolac resins, bisphenol A-based novolac resins, dicyclopentadiene-based phenol resins, Xylok-based phenol resins, terpene-modified phenol resins, polyvinyl phenols, the naphtholaralkyl-based phenol resins represented by formula (8), the biphenylaralkyl-based phenol resins represented by formula (9), naphthalene-based phenol resins, and aminotriazine novolac-based phenol resins.

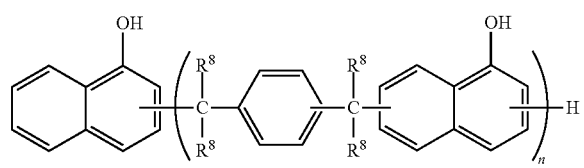

(8)

wherein $R^8$ each independently represents a hydrogen atom or a methyl group; among these, a hydrogen atom is preferable; n represents an integer of 1 or more; the upper limit value of n is generally 10, preferably 6.

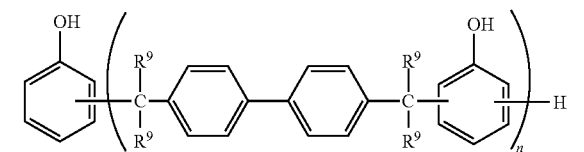

(9)

wherein $R^9$ each independently represents a hydrogen atom or a methyl group; among these, a hydrogen atom is preferable; n represents an integer of 1 or more; the upper limit value of n is generally 10, preferably 7.

These phenol resins (C) may be used singly or in combinations.

Especially, the phenol resin (C) preferably comprises one or more selected from the group consisting of cresol novolac-based phenol resins, aminotriazine novolac-based phenol resins, naphthalene-based phenol resins, the naphtholaralkyl-based phenol resins represented by formula (8), and the biphenylaralkyl-based phenol resins represented by formula (9), more preferably comprises one or more selected from the group consisting of cresol novolac-based phenol compounds, the naphtholaralkyl-based phenol resins represented by formula (8), and the biphenylaralkyl-based phenol resins represented by formula (9). The phenol resin (C) still more preferably comprises one or more selected from the group consisting of the naphtholaralkyl-based phenol resins represented by formula (8) and the biphenylaralkyl-based phenol resins represented by formula (9). Such a phenol resin (C) reduces the water absorption of the resulting cured product and enhances the heat resistance thereof more significantly.

When the resin composition according to one aspect of the present invention comprises the phenol resin (C), the ratio (OH/Ep) of the number of phenol groups of the phenol resin (C) to the total number of epoxy groups of the compounds having epoxy groups is preferably 0.7 to 2.5, more preferably 0.8 to 2.0, still more preferably 0.85 to 1.8. At a ratio (OH/Ep) of 0.7 or more, the resulting cured product has an improved glass transition temperature. At a ratio (OH/Ep) of 2.5 or less, the flame retardancy of the resulting cured product is more significantly enhanced.

When the cyanic acid ester compound (B) or the phenol resin (C) is used as a single component, the content of the cyanic acid ester compound (B) and the content of the phenol resin (C) in the resin composition indicates the content of the cyanic acid ester compound (B) or the phenol resin (C) as the single component. When these components are used in combination, the content of the cyanic acid ester compound (B) and the content of the phenol resin (C) in the resin composition indicates the total content of these two components, which both can function as curing agents in the resin composition.

In the resin composition according to one aspect of the present invention, the component (B) and/or the component (C) can be used at any content. The content is preferably 10 to 50 parts by mass, more preferably 15 to 45 parts by mass, still more preferably 20 to 40 parts by mass based on 100 parts by mass of the total content of the component (A), the component (B), the component (C), and optional components, i.e., the halogen-free epoxy resin (E) and the maleimide compound (F).

In the resin composition according to another aspect of the present invention, the component (B) and/or the component (C) can be used at any content. The content is preferably 5 to 50 parts by mass more preferably 10 to 40 parts by mass, still more preferably 10 to 35 parts by mass based on 100 parts by mass of the total content of the component (A), the component (G), and an optional component, i.e., the halogen-free epoxy resin (E).

If the content of the cyanic acid ester compound (B) and/or the phenol resin (C) is within this range, the degree of cure, the flame retardancy, the glass transition temperature, and the elastic modulus of the resulting cured product are enhanced more significantly, and the water absorption thereof is reduced more significantly.

[Inorganic Filler (D)]

The inorganic filler (D) contained in the resin composition reduces the coefficient of thermal expansion of the resulting cured product and enhances the resistance to flame more significantly. The inorganic filler (D) can be any inorganic filler typically used in the art. Examples thereof include silicas such as natural silica, fused silica, amorphous silica, and hollow silica; aluminum hydroxide and heated products of aluminum hydroxide (aluminum hydroxide heated to remove part of crystalline water); metal hydrates such as boehmite and magnesium hydroxide; molybdenum compounds such as molybdenum oxide and zinc molybdate; zinc borate, zinc stannate, alumina, clay, kaolin, talc, calcined clay, calcined kaolin, calcined talc, mica, glass short fibers (glass fine particles such as E-glass and D-glass), hollow glass, and spherical glass.

Among these, the inorganic filler (D) preferably comprises one or more selected from the group consisting of silicas, boehmite, magnesium hydroxide, alumina, and talc, more preferably comprises one or more selected from the group consisting of boehmite and silicas. Such an inorganic filler (D) reduces the coefficient of thermal expansion of the resulting cured product and enhances the resistance to flame more significantly.

Furthermore, the inorganic filler (D) preferably comprises a molybdenum compound or a molybdic acid compound coated with inorganic oxide from the viewpoint of drilling processability.

These inorganic fillers (D) may be used singly or in combinations.

The inorganic filler (D) can have any average particle size (D50). The average particle size (D50) is preferably 0.2 to 5 μm, more preferably 0.3 to 4 μm, still more preferably 0.3 to 3 μm. At an average particle size (D50) of the inorganic filler (D) within this range, the dispersibility of the inorganic filler (D) in the resin composition is enhanced more significantly. Here, the "average particle size (D50)" indicates a median particle size or a median particle diameter when the particle size distribution of the measured powder is divided into two, and the number or the mass of particles having larger diameters and the number or the mass of particles having smaller diameters each constitute 50% of the entire powder. The average particle size (D50) of the inorganic filler (D) can be typically measured by a wet laser diffraction scattering method.

In the resin composition according to one aspect of the present invention, the inorganic filler (D) can be used in any content. The content is preferably 50 to 400 parts by mass, more preferably 80 to 300 parts by mass, still more preferably 100 to 250 parts by mass based on 100 parts by mass of the total content of the component (A), the component (B), and the component (C), and optional components, i.e., the halogen-free epoxy resin (E) and the maleimide compound (F).

In the resin composition according to another aspect of the present invention, the inorganic filler (D) can be used at any content. The content is preferably 50 to 400 parts by mass, more preferably 80 to 300 parts by mass, still more preferably 100 to 250 parts by mass based on 100 parts by mass of the total content of the component (A), the component (G), and an optional component, i.e., the halogen-free epoxy resin (E).

At a content of the inorganic filler (D) within the range, the flame retardancy, the molding properties, and the drilling processability of the resulting cured product are more significantly enhanced.

To enhance the dispersibility of the inorganic filler (D) or the bonding strength of the resin and the inorganic filler or a glass cloth, the resin composition may contain a silane coupling agent or a wet dispersant in addition to the inorganic filler (D).

The silane coupling agent can be any silane coupling agent typically used in the surface treatment of inorganic substances. Examples thereof include aminosilane coupling agents such as γ-aminopropyltriethoxysilane and N-β-(aminoethyl)-γ-aminopropyltrimethoxysilane; epoxy silane coupling agents such as γ-glycidoxypropyltrimethoxysilane; vinyl silane coupling agents such as γ-metaacryloxypropyltrimethoxysilane; cationic silane coupling agents such as N-β-(N-vinylbenzylaminoethyl)-γ-aminopropyltrimethoxysilane hydrochloride; and phenylsilane coupling agents. These silane coupling agents can be used singly or in any combinations.

Examples of the wet dispersant include, but should not be limited to, Disperbyks (registered trademark)-110, 111, 180, and 161 and BYKs (registered trademark)-W996, W9010, and W903 available from BYK Japan K.K. A dispersion stabilizer used in a coating material can also be used.

[Halogen-Free Epoxy Resin (E)]

Preferably, the resin compositions according to first and second embodiments further comprise a halogen-free epoxy resin (E) (hereinafter also referred to as a "component (E)"). The halogen-free epoxy resin (E) contained in the resin composition enhances curing properties, and can suppress generation of harmful substances during disposal. For the same reason, it is preferable that the resin composition do not contain any compound containing a phosphorus element.

The halogen-free epoxy resin (E) can be any halogen-free epoxy resin not having a halogen atom in the molecule structure, and examples thereof include phenol phenyl aralkyl novolac-based epoxy resins represented by formula (10), phenol biphenylaralkyl-based epoxy resins represented by formula (11), naphtholaralkyl-based epoxy resins represented by formula (12), anthraquinone-based epoxy resin represented by formula (13), polyoxynaphthylene-based epoxy resins represented by formula (14) or formula (15), bisphenol A-based epoxy resins, bisphenol F-based epoxy resins, phenol novolac-based epoxy resins, cresol novolac-based epoxy resins, bisphenol A novolac-based epoxy resins, trifunctional phenol-based epoxy resins, tetrafunctional phenol-based epoxy resins, naphthalene-based epoxy resins, biphenyl-based epoxy resins, aralkyl novolac-based epoxy resins, alicyclic epoxy resins, polyol-based epoxy resins, glycidyl amines, glycidyl esters, compounds having epoxyfied double bond such as butadiene, and compounds prepared by a reaction of hydroxyl group-containing silicone resins with epichlorohydrin.

Among these, the halogen-free epoxy resin (E) preferably comprises one or more selected from the group consisting of phenol phenyl aralkyl novolac-based epoxy resins represented by formula (10), phenol biphenylaralkyl-based epoxy resins represented by formula (11), naphtholaralkyl-based epoxy resins represented by formula (12), anthraquinone-based epoxy resins represented by formula (13), and polyoxynaphthylene-based epoxy resins represented by formula (14) or formula (15). More preferably, the halogen-free epoxy resin (E) comprises one or more selected from the group consisting of anthraquinone-based epoxy resins represented by formula (13) and polyoxynaphthylene-based epoxy resins represented by formula (14) or formula (15). Such a halogen-free epoxy resin (E) reduces the coefficient of thermal expansion and the flame retardancy of the resulting cured product.

These halogen-free epoxy resins (E) can be used singly or in any combinations.

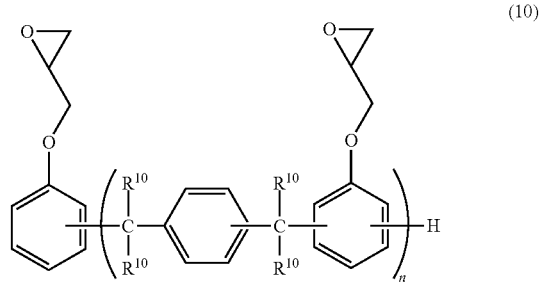

(10)

wherein $R^{10}$ each independently represents a hydrogen atom or a methyl group; among these, a hydrogen atom is preferable; n represents an integer of 1 or more; the upper limit value of n is generally 10, preferably 7.

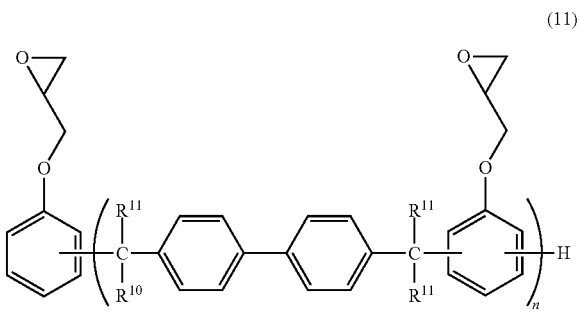

(11)

wherein $R^{11}$ each independently represents a hydrogen atom or a methyl group; among these, a hydrogen atom is preferable; n represents an integer of 1 or more; the upper limit value of n is generally 10, preferably 7.

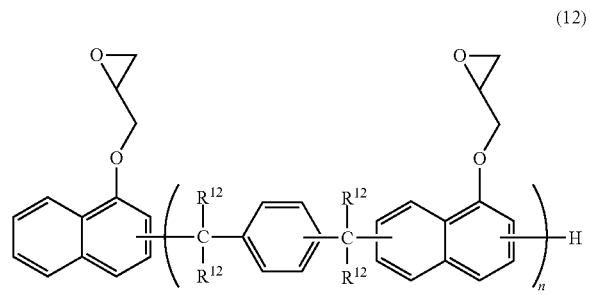

(12)

wherein $R^{12}$ each independently represents a hydrogen atom or a methyl group; among these, a hydrogen atom is preferable; n represents an integer of 1 or more; the upper limit value of n is generally 10, preferably 7.

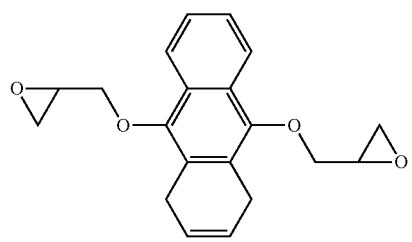

(13)

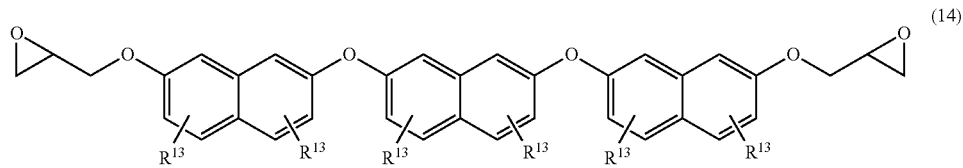

(14)

wherein $R^{13}$ each independently represents a hydrogen atom or an alkyl or aralkyl group having 1 to 4 carbon atoms.

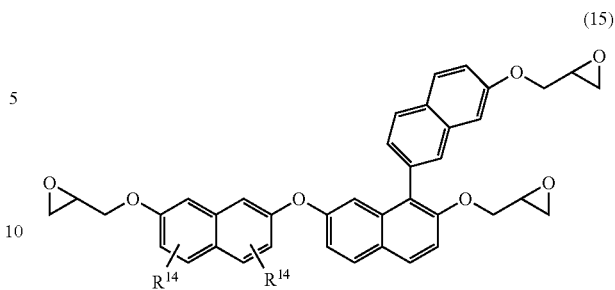

(15)

wherein $R^{14}$ each independently represents a hydrogen atom or an alkyl or aralkyl group having 1 to 4 carbon atoms.

Examples of commercial products of the polyoxynaphthylene-based epoxy resin represented by formula (14) or formula (15) include, but should not be limited to, EXA-7311, EXA-7311-G3, EXA-7311-G4, EXA-7311-G4S, EXA-7311L, and HP-6000 available from DIC Corporation.

The resin composition according to one aspect of the present invention can contain the halogen-free epoxy resin (E) at any content. The content is preferably 5 to 60 parts by mass, more preferably 10 to 40 parts by mass, still more preferably 15 to 40 parts by mass based on 100 parts by mass of the total content of the component (A), the component (B), the component (C), and optional components, i.e., the halogen-free epoxy resin (E) and the maleimide compound (F).

The resin composition according to another aspect of the present invention can contain the halogen-free epoxy resin (E) at any content. The content is preferably 5 to 60 parts by mass, more preferably 10 to 40 parts by mass, still more preferably 15 to 40 parts by mass based on 100 parts by mass of the total content of the component (A), the component (G), and an optional component, i.e., the halogen-free epoxy resin (E).

At a content of the halogen-free epoxy resin (E) within the range, the degree of cure, the flame retardancy, the glass transition temperature, and the elastic modulus of the resulting cured product are more significantly enhanced, and the water absorption thereof is more significantly reduced.

[Other Epoxy Resins]

Furthermore, the resin composition can contain a phosphorus-containing epoxy resin or a halogenated epoxy resin in combination with the components above depending on applications.

The phosphorus-containing epoxy resin can be any phosphorus atom-containing compound having two or more epoxy groups in one molecule. Examples thereof include FX-289B and FX-305 (available from NIPPON STEEL & SUMIKIN CHEMICAL CO., LTD.).

The halogenated epoxy resin can be any halogen atom-containing compound having two or more epoxy groups in one molecule. Examples thereof include brominated epoxy resins such as brominated bisphenol A-based epoxy resins and brominated phenol novolac-based epoxy resins.

[Maleimide Compound (F)]

The maleimide compound (F) contained in the resin composition attains higher heat resistance.

The maleimide compound (F) can be any compound having one or more maleimide groups in one molecule. Examples thereof include N-phenylmaleimide, N-hydroxyphenylmaleimide, bis(4-maleimidephenyl)methane, 2,2-bis{4-(4-maleimidephenoxy)-phenyl}propane, bis(3,5-dimethyl-4-maleimidephenyl)methane, bis(3-ethyl-5-methyl-4-maleimidephenyl)methane, bis(3,5-diethyl-4-maleimidephenyl)methane, and maleimide compounds represented by formula (16); prepolymers of these maleimide compounds; or prepolymers of maleimide compounds and amine compounds.

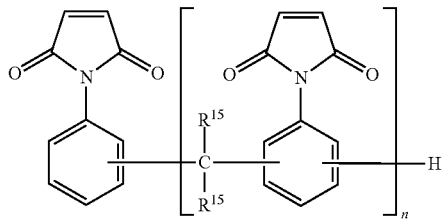

(16)

(wherein $R^{15}$ each independently represents a hydrogen atom or a methyl group; among these, a hydrogen atom is preferable; n represents an integer of 1 or more).

These maleimide compound (F) may be used singly or in combinations.

Among these, the maleimide compound (F) preferably comprises one or more selected from the group consisting of bis(4-maleimidephenyl)methane, 2,2-bis{4-(4-maleimidephenoxy)-phenyl}propane, bis(3-ethyl-5-methyl-4-maleimidephenyl)methane, and maleimide compounds represented by formula (16). More preferably, the maleimide compound (F) comprises a maleimide compound represented by formula (16). Such a maleimide compound (F) attains higher heat resistance.

The resin composition according to one aspect of the present invention can contain the maleimide compound (F) at any content. The content is preferably 3 to 50 parts by mass, more preferably 10 to 40 parts by mass, still more preferably 10 to 35 based on 100 parts by mass of the total content of the component (A), the component (B), the component (C), and optional components, i.e., the halogen-free epoxy resin (E) and the maleimide compound (F).

The resin composition according to another aspect of the present invention can contain the maleimide compound (F) at any content. The content is preferably 3 to 50 parts by mass, more preferably 10 to 40 parts by mass, still more preferably 10 to 35 based on 100 parts by mass of the total content of the component (A), the component (G), and an optional component, i.e., the halogen-free epoxy resin (E).

At a content of the maleimide compound (F) within the range, the degree of cure, the flame retardancy, the glass transition temperature, and the elastic modulus of the resulting cured product are more significantly enhanced, and the water absorption thereof is more significantly reduced.

[BT Resin (G)]

The resin composition comprises a prepolymer of the cyanic acid ester compound (B) and the maleimide compound (F), i.e., a BT resin (G) (hereinafter also referred to as a "BT resin (G)"). The BT resin (G) contained in the resin composition attains higher heat resistance.

The BT resin (G) can be prepared by mixing the cyanic acid ester compound (B) with the maleimide compound (F) under heating without a solvent or in the solvent to form a prepolymer. Any solvent can be used without limitation. Examples thereof include organic solvents such as methyl ethyl ketone, N-methylpyrrolidone, dimethylformamide, dimethylacetamide, toluene, and xylene.

Examples of the cyanic acid ester compound (B) used as the raw material for the BT resin (G) include the same compounds as those listed above. Among these, the cyanic acid ester compound (B) used as the raw material for the BT resin (G) preferably comprises at least one selected from the group consisting of the naphtholaralkyl-based cyanic acid ester compounds represented by formula (6), the novolac-based cyanic acid esters represented by formula (7), and biphenylaralkyl-based cyanic acid esters. More preferably, the cyanic acid ester compound (B) comprises at least one selected from the group consisting of the naphtholaralkyl-based cyanic acid ester compounds represented by formula (6) and the novolac-based cyanic acid ester compounds represented by formula (7). Such a cyanic acid ester compound (B) enhances the flame retardancy and the curing properties of the resulting cured product more significantly, and reduces the coefficient of thermal expansion more significantly.

Examples of the maleimide compound (F) used as the raw material for the BT resin (G) include the same compounds as those listed above. Among these, the maleimide compound (F) used as the raw material for the BT resin (G) preferably includes at least one selected from the group consisting of bis(4-maleimidephenyl)methane, 2,2-bis{4-(4-maleimidephenoxy)-phenyl}propane, bis(3-ethyl-5-methyl-4-maleimidephenyl)methane, and the maleimide compounds represented by formula (16). More preferably, the maleimide compound (F) includes a maleimide compound exemplified in formula (16). Such a maleimide compound (F) attains higher heat resistance.

The proportion of the maleimide compound (F) in the BT resin (G) is preferably 5 to 75% by mass, more preferably 10 to 70% by mass, still more preferably 20 to 60% by mass based on 100% by mass of the BT resin (G). If the proportion of the maleimide compound (F) in the BT resin (G) is within the range, the glass transition temperature, the flame retardancy, and the curing properties of the resulting cured product are more significantly enhanced.

The number average molecular weight of the BT resin (G) is preferably 100 to 100,000, more preferably 200 to 50,000, still more preferably 300 to 10,000. At a number average molecular weight of the BT resin (G) within the range, the handling properties and the curing properties of the resin composition and the glass transition temperature of the resulting cured product are more significantly enhanced.

The resin composition according to another aspect of the present invention can contain the BT resin (G) at any content. The content is preferably 20 to 80 parts by mass, more preferably 30 to 70 parts by mass, still more preferably 40 to 60 parts by mass based on 100 parts by mass of the total content of the component (A), the component (G), and an optional component, i.e., the halogen-free epoxy resin (E). At a content of the BT resin (G) within the range, the degree of cure, the flame retardancy, the glass transition temperature, and the elastic modulus of the resulting cured product are more significantly enhanced, and the water absorption thereof is more significantly reduced.

The BT resin (G) can be prepared by any known method. Examples thereof include a method of mixing the cyanic acid ester compound (B) with the maleimide compound (F) under heating by a known method to form a prepolymer.

[Imidazole Compound (H)]

The resin composition may further comprise an imidazole compound (H). The imidazole compound (H) accelerates curing. The imidazole compound (H) attains a cured product having an improved glass transition temperature.

Examples of the imidazole compound (H) include, but should not be limited to, imidazole compounds represented by formula (17) and 2-ethyl-4-methylimidazole:

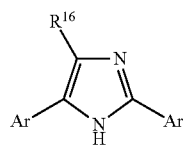

(17)

(wherein Ar each independently represents a phenyl group, a naphthalene group, a biphenyl group, an anthracene group, or a hydroxyl-modified phenyl, naphthalene, biphenyl, or anthracene group; $R^{16}$ represents a hydrogen atom, an alkyl or hydroxyl-modified alkyl group, or an aryl group).

Ar each independently represents a phenyl group, a naphthalene group, a biphenyl group, an anthracene group, or a hydroxyl-modified group thereof. Among these, a phenyl group is preferable.

$R^{16}$ is a hydrogen atom, an alkyl or hydroxyl-modified alkyl group, or an aryl group such as a phenyl group. Among these, Ar and $R^{16}$ both are preferably a phenyl group.

The imidazole compound (H) can be any imidazole compound. For example, 2,4,5-triphenylimidazole and 2-phenyl-4-methylimidazole are preferable. Such an imidazole compound (H) more significantly enhances curing properties and the glass transition temperature of the cured product.

The resin composition according to one aspect of the present invention can contain the imidazole compound at any content. The content is preferably 0.01 to 10 parts by mass, more preferably 0.1 to 5 parts by mass, still more preferably 0.1 to 3 parts by mass based on 100 parts by mass of the total content of the component (A), the component (B), and the component (C), optional components, i.e., the halogen-free epoxy resin (E) and the maleimide compound (F).

The resin composition according to another aspect of the present invention can contain the imidazole compound at any content. The content is preferably 0.01 to 10 parts by mass, more preferably 0.1 to 5 parts by mass, still more preferably 0.1 to 3 parts by mass based on 100 parts by mass of the total content of the component (A), the component (G), and an optional component, i.e., the halogen-free epoxy resin (E).

At a content of the imidazole compound within the range, the degree of cure, the glass transition temperature, and the elastic modulus of the resulting cured product are more significantly enhanced, and the water absorption thereof is more significantly reduced.

[Other Curing Accelerators]

The resin composition may optionally comprise other curing accelerators other than the imidazole compound. Examples of such a curing accelerator include, but should not be limited to, organic peroxides such as benzoyl peroxide, lauroyl peroxide, acetyl peroxide, parachlorobenzoyl peroxide, and di-tert-butyl-di-perphthalate; azo compounds such as azobisnitrile; tertiary amines such as N,N-dimethylbenzylamine, N,N-dimethylaniline, N,N-dimethyltoluidine, 2-N-ethylanilinoethanol, tri-n-butylamine, pyridine, quinoline, N-methylmorpholine, triethanolamine, triethylenediamine, tetramethylbutanediamine, and N-methylpiperidine; phenols such as phenol, xylenol, cresol, resorcin, and catechol; organic metal salts such as lead naphthenate, stearic acid lead, zinc naphthenate, zinc octylate, tin oleate, dibutyltin maleate, manganese naphthenate, cobalt naphthenate, and acetylacetone iron; these organic metal salts dissolved in hydroxyl group containing compounds such as phenol and bisphenol; inorganic metal salts such as tin chloride, zinc chloride, and aluminum chloride; and organic tin compounds such as dioctyltin oxide, alkyl tin other than dioctyltin and alkyl tin oxide.

[Silicone Powder]

The resin composition may optionally comprise a silicone powder. The silicone powder acts as a flame retardant aid to defer the burning time, enhancing flame retardancy. A silicone powder having low hardness contained in the resin composition enhances the drilling processability of the resulting cured product more significantly.

Examples of the silicone powder include, but should not be limited to, fine particles of polymethylsilsesquioxane having siloxane bonds crosslinked to form a three-dimensional net, fine particles of addition polymerized products of vinyl group-containing dimethylpolysiloxane and methylhydrogen polysiloxane, fine particles of addition polymerized products of vinyl group-containing dimethylpolysiloxane and methylhydrogen polysiloxane having surfaces coated with polymethylsilsesquioxane having siloxane bonds crosslinked to form a three-dimensional net, and inorganic carriers having surfaces coated with polymethylsilsesquioxane having siloxane bonds crosslinked to form a three-dimensional net.

The silicone powder can have any average particle size (D50). Considering dispersibility, the average particle size (D50) is preferably 1 to 15 μm. The average particle size (D50) of the silicone powder can be measured by the same method as in the measurement of the average particle size (D50) of the inorganic filler (D).

The resin composition according to one aspect of the present invention can contain the silicone powder as an optional component at any content. The content is preferably 3 to 120 parts by mass, more preferably 5 to 80 parts by mass, still more preferably 10 to 60 based on 100 parts by mass of the total content of the component (A), the component (B), the component (C), and optional components, i.e., the halogen-free epoxy resin (E) and the maleimide compound (F).

The resin composition according to another aspect of the present invention can contain the silicone powder as an optional component at any content. The content is preferably 3 to 120 parts by mass, more preferably 5 to 80 parts by mass, still more preferably 10 to 60 based on 100 parts by mass of the total content of the component (A), the component (G), and an optional component, i.e., the halogen-free epoxy resin (E).

At a content of the silicone powder within the range, the flame retardancy, the drilling processability, and the molding properties of the resulting cured product are more significantly enhanced.

[Solvent]

Furthermore, the resin composition may optionally comprise a solvent. The solvent contained in the resin composition reduces the viscosity during preparation of the resin composition, enhances the handling properties, and attains higher impregnation of the resin composition into the base material such as a glass cloth.

The solvent can be any solvent that can dissolve a mixture of the component (A), the component (B) and/or the component (C) or a mixture of the component (A) and the component (B). Specific examples thereof include ketones such as acetone, methyl ethyl ketone, and methyl cellosolve; aromatic hydrocarbons such as toluene and xylene; amides such as dimethylformamide; and propylene glycol methyl ether and acetate thereof. These solvents can be used singly or in any combinations.

[Method of Preparing Resin Composition]

The resin composition can be prepared by any normal method without limitation. For example, the component (A), the component (B), and the component (D) can be sequentially compounded in a solvent and sufficiently stirred to readily prepare the resin composition according to the present embodiment. Thereby, a resin composition uniformly containing the component (A), the component (B) and/or the component (C), the component (D), and the other optional components described above, or a resin composition uniformly containing the component (A), the component (G), the component (D), and the other optional components described above can be prepared.

In the preparation of the resin composition according to the present embodiment, an organic solvent can be optionally used. Examples of the organic solvent include, but should not be limited to, those that can dissolve a mixture of the component (A), the component (B) and/or the component (C) or a mixture of the component (A) and the component (G). Specific examples thereof include the same organic solvents as those that can be contained in the resin composition.

During the preparation of the resin composition, the respective components can be uniformly dissolved or dispersed by a known method (such as stirring, mixing, and kneading). For example, the inorganic filler (D) can be uniformly dispersed in the resin composition by stirring and dispersion in a stirring tank provided with a stirrer having a proper stirring ability. The stirring, the mixing, and the kneading can be properly performed with a known apparatus, e.g., an apparatus for mixing such as a ball mill and a bead mill, or a revolving or rotary mixing apparatus.

[Prepreg]

The prepreg according to the present embodiment comprises a base material, and a resin composition impregnated into or applied to the base material. The prepreg according to the present embodiment has high flame retardancy, heat resistance, and drilling processability and has a low coefficient of thermal expansion. Examples of the method of preparing a prepreg include, but should not be limited to, known methods such as a method of impregnating or applying a resin composition into or to a base material, and heating the base material in a dryer at 100 to 200° C. for 1 to 30 minutes to partially cure the resin composition (to form the resin composition into a B stage).

The content of the resin composition (comprising the inorganic filler) is preferably 30 to 90% by mass, more preferably 35 to 80% by mass, still more preferably 40 to 75% by mass based on 100% by mass of the prepreg. At a content of the resin composition within the range, higher molding properties and a lower coefficient of thermal expansion are attained.

The base material can be any known base material used in a variety of materials for printed circuit boards, and can be properly selected according to desired applications and performance for use. Examples of such a base material include glass fibers such as E-glass, D-glass, S-glass, Q-glass, spherical glass, NE-glass, and T-glass; inorganic fibers other than glass such as quartz; and organic fibers such as wholly aromatic polyamides such as polyparaphenylene terephthalamide (Kevlar (registered trademark), available from E. I. du Pont de Nemours and Company) and co-polyparaphenylene.3,4'-oxydiphenylene.terephthalamide (Technora (registered trademark), available from Teijin Techno Products Limited), polyesters such as 2,6-hydroxynaphthoic acid.parahydroxybenzoic acid (Vectran (registered trademark), available from Kuraray Co., Ltd.), polyparaphenylene benzoxazole (Zylon (registered trademark), available from TOYOBO CO., LTD.), and polyimides.

Among these, the base material preferably comprises one or more selected from the group consisting of an E-glass cloth, a T-glass cloth, an S-glass cloth, a Q-glass cloth, and organic fibers. Such a base material attains lower thermal expansivity.

These base materials can be used singly or in any combinations.

The base material can have any form. Examples thereof include woven fabrics, non-woven fabrics, roving mats, chopped strand mats, and surfacing mats. The woven fabric can be any known woven fabric such as plain woven cloths, basket woven cloths, and twilled cloths, and can be properly selected according to the desired application or performance for use. These cloths subjected to opening or glass woven fabrics surface treated with a silane coupling agent are suitably used.

The base material can have any thickness. The base material typically having a thickness of about 0.01 to 0.3 mm is suitably used. Especially from the viewpoint of strength and moisture absorbing properties, the base material is preferably a glass woven fabric having a thickness of 200 μm or less and a mass of 250 g/m$^2$ or less, and is more preferably a glass woven fabric comprising glass fibers of E-glass.

[Laminate]

The laminate according to the present embodiment comprises one or more layers of the prepreg. The laminate according to the present embodiment has high flame retardancy, heat resistance, and drilling processability and a low coefficient of thermal expansion. The laminate can be prepared by lamination molding the prepreg in combination with an additional layer. The additional layer can be any layer. Examples thereof include circuit boards for an inner layer separately prepared.

[Metallic Foils Clad Laminate]

The metal foil clad laminate according to the present embodiment comprises the prepreg, and a metallic foil laminated on the prepreg. The metal foil clad laminate according to the present embodiment has high molding properties, flame retardancy, heat resistance, and drilling processability and a low coefficient of thermal expansion, and can be especially effectively used as a printed circuit board for semiconductor packaging required for such performance. The metal foil clad laminate according to the present embodiment can be prepared by disposing at least one or more layers of the prepreg, disposing a metallic foil on one or both surfaces of the prepreg or the layered prepregs, and lamination molding the layered product. Specifically, one or more prepregs are disposed, and if desired, a metallic foil of copper or aluminum is disposed on one or both surfaces of the prepreg or the layered prepregs. The resulting layered product can be optionally lamination molded to prepare a metal foil clad laminate according to the present embodiment.

The metallic foil used here can be any metallic foil used as materials for printed circuit boards, and is preferably a known copper foil such as a rolled copper foil and an electrodeposited copper foil. The metallic foil can have any thickness. The thickness is preferably 2 to 70 μm, more preferably 2 to 35 μm.

The metal foil clad laminate can be molded by any method under any molding condition. A standard method and standard conditions applied to laminates and multi-layer plates for printed circuit boards can be used. For example, the metal foil clad laminate can be molded with a multi-stage press, a multi-stage vacuum press, a continuous molding machine, or an autoclave molding machine.

Typically, the molding temperature is in the range of 100 to 300° C., the molding pressure is in the range of 2 to 100 kgf/cm² in terms of planar pressure, and the heating time is in the range of 0.05 to 5 hours. Optionally, post-curing can be performed at a temperature of 150 to 300° C. Alternatively, the prepreg according to the present embodiment in combination with a circuit board for an inner layer separately prepared can be lamination molded to prepare a metal foil clad laminate.

The metal foil clad laminate according to the present embodiment includes a metallic foil having a predetermined wiring pattern. Such a metal foil clad laminate can be suitably used as a printed circuit board.

[Printed Circuit Board]

The printed circuit board according to the present embodiment comprises an insulating layer and a conductive layer disposed on a surface of the insulating layer. The insulating layer comprises the resin composition according to first or second embodiment. The printed circuit board according to the present embodiment has high flame retardancy, heat resistance, and drilling processability and a low coefficient of thermal expansion.

The insulating layer can be any layer comprising the resin composition according to the present embodiment. Examples thereof include the prepreg according to the present embodiment.

Examples of the conductive layer include, but should not be limited to, layers formed of a metallic foil in the metal foil clad laminate.

The printed circuit board according to the present embodiment can be prepared by the following method, for example. First, a metal foil clad laminate such as a copper clad laminate according to the present embodiment is prepared. The surface of the metal foil clad laminate is etched to form an inner layer circuit. The surface of the inner layer circuit for an inner layer base material is optionally surface treated to enhance bonding strength. Then, the prepreg according to the present embodiment is layered as many as needed on the surface of the inner layer circuit. A metallic foil for an outer layer circuit is laminated on the layered prepreg. The resulting laminate is molded into one by heating under pressure. Thus, a multi-layered laminate is prepared, in which the base material and the insulating layer formed of a cured product of the thermosetting resin composition are disposed between the inner layer circuit and the metallic foil for an outer layer circuit. Then, the multi-layered laminate is drilled for formation of through holes or via holes. A plated metal coating is formed on the wall surfaces of these holes to electrically conduct the inner layer circuit and the metallic foil for an outer layer circuit. Then, the metallic foil for an outer layer circuit is etched to form an outer layer circuit. A printed circuit board is prepared.

EXAMPLES

The present invention will now be described in more detail by way of Examples and Comparative Examples, but the present invention will not be limited to these Examples.

Synthesis Example 1 Synthesis of Epoxy Silicone Resin A1

Epoxy silicone resin A1 was prepared with polysiloxane XF42-C3294 (887 parts by mass) (available from Momentive Performance Materials Japan LLC; a linear polydimethylsiloxane compound having alcoholic hydroxyl groups at both terminals; in formula (1), $R^1$ was a methyl group, n was 8, $R^2$ was represented by formula (2), the average of l was 1.5, alcoholic hydroxyl group equivalent: 480 g/mol), and hexahydrophthalic anhydride (285 parts by mass) as an acid anhydride component.

The raw materials were placed in a 3 L separable flask provided with a stirring motor, a reflux cooling tube, and a nitrogen line, and were heated to 160° C. under stirring. After the temperature reached 160° C., stirring was continued for 4 hours to synthesize a linear polysiloxane (a) having carboxyl groups at both terminals (linear polysiloxane having carboxyl groups at both terminals).

Then, a cyclic epoxy resin (b), i.e., 3,4-epoxycyclohexenylmethyl-3',4'-epoxycyclohexene carboxylate (1491 parts by mass, epoxy equivalent: 130 g/eq.) was added to the linear polysiloxane (a) having a carboxyl group in the separable flask. At this time, the epoxy group of the cyclic epoxy compound (b) was 4.7 equivalents based on the carboxyl group of the hemiester group in the linear polysiloxane (a) having a carboxyl group. Next, as a reaction catalyst, a 4% solution of tetraethylammonium chloride in acetic acid (0.9 parts by mass) was added dropwise into the separable flask to perform a reaction at a reaction temperature of 170° C. for 5 hours. A sample was extracted, and it was checked by the measurement of the acid value that the carboxyl group was consumed. The resin in the reaction mixed solution was filtered through a metal mesh of 150 mesh. Thus, Epoxy silicone resin A1 (2450 parts by mass) was prepared. The epoxy equivalent of the resulting resin was 298 g/eq., and the viscosity at room temperature (25° C.) was 4.8 Pa·s.

The epoxy equivalent of Epoxy silicone resin A1 was measured by titration according to JIS K7236:2001. The viscosity at room temperature (25° C.) of Epoxy silicone resin A1 was measured with a B type viscometer according to JIS Z8803. The epoxy equivalent and the viscosity below were measured by the same methods.

Synthesis Example 2 Synthesis of Epoxy Silicone Resin A2

Epoxy silicone resin A2 was prepared with polysiloxane (XF42-C3294, 47 parts by mass), hydrogenated bisphenol A (12 parts by mass, alcoholic hydroxyl group equivalent: 120 g/mol) as an alcohol compound, and hexahydrophthalic anhydride (31 parts by mass) as an acid anhydride. The molar ratio of polysiloxane/alcohol compound was 1, and the acid anhydride was 2 mol based on 1 mol of the total of polysiloxane and the alcohol compound.

These raw materials were placed in a 300 mL separable flask provided with a stirring motor, a reflux cooling tube, and a nitrogen line, and were heated to 160° C. under stirring. After the temperature reached 160° C., stirring was continued for 4 hours to synthesize a linear polysiloxane (a) (linear polysiloxane having carboxyl groups at both terminals).

Then, triglycidyl isocyanurate (93 parts by mass, epoxy equivalent: 100 g/eq.) as the cyclic epoxy resin (b) was added to the reaction mixture containing the linear polysiloxane (a) having a carboxyl group in the separable flask. At this time, the epoxy group of the cyclic epoxy compound (b) was 4.7 equivalents based on the carboxyl group of the hemiester group in the linear polysiloxane (a) having a carboxyl group. Next, as a reaction catalyst, a 4% solution of tetraethylammonium chloride in acetic acid (0.9 parts by mass) was added dropwise to perform a reaction at a reaction temperature of 170° C. for 5 hours. A sample was extracted, and it was checked by the measurement of the acid value that the carboxyl group was consumed. The resin in the reaction mixed solution was filtered through a metal mesh of 150 mesh. Thus, Epoxy silicone resin A2 (160 parts by mass) was prepared. The epoxy equivalent of the resulting resin was 249 g/eq. The resin was a solid resin having a softening point of 55° C. The viscosity at 150° C. was 0.37 Pa·s.

Synthesis Example 3 Synthesis of Cyanic Acid Ester Compound B1

A reactor provided with a thermometer, a stirrer, a dropping funnel, and a reflux cooler was preliminarily cooled with brine to 0 to 5° C. Cyanogen chloride (7.47 g, 0.122 mol), 35% hydrochloric acid (9.75 g, 0.0935 mol), water (76 mL), and methylene chloride (44 mL) were placed in the reactor.

While the reactor was kept at an inner temperature of −5 to +5° C. and a pH of 1 or less, a solution prepared by dissolving an α-naphtholaralkyl-based phenol resin where $R^8$ in formula (8) all was hydrogen atoms (SN485, OH group equivalent: 214 g/eq., softening point: 86° C., available from NIPPON STEEL & SUMIKIN CHEMICAL CO., LTD.) (20 g, 0.0935 mol) and triethylamine (14.16 g, 0.14 mol) in methylene chloride (92 mL) was added dropwise with the dropping funnel over 1 hour under stirring. After the dropping was completed, triethylamine (4.72 g, 0.047 mol) was additionally added dropwise over 15 minutes.

After the dropping was completed, the solution was stirred at the same temperature as above for 15 minutes. The reaction solution was separated to extract an organic layer. The extracted organic layer was washed with water (100 mL) twice. Methylene chloride was distilled off with an evaporator under reduced pressure. The product was finally condensed, was dried, and was solidified at 80° C. for 1 hour to prepare Cyanic acid ester compound B1 (α-naphtholaralkyl-based cyanic acid ester resin, cyanate equivalent: 261 g/eq., 23.5 g).

Synthesis Example 4 Synthesis of BT Resin G1

Cyanic acid ester compound B1 prepared in Synthesis Example 3 (cyanate equivalent: 261 g/eq., 36 parts by mass) and a maleimide compound where $R^{15}$ in formula (16) all was hydrogen atoms, n was 2 to 3 (BMI-2300, available from Daiwakasei Industry Co., Ltd., 24 parts by mass) were dissolved in dimethylacetamide, and were reacted at 150° C. under stirring to prepare BT resin G1.

Synthesis Example 5 Synthesis of BT Resin G2

Cyanic acid ester compound B1 prepared in Synthesis Example 3 (cyanate equivalent: 261 g/eq., 30 parts by mass) and a maleimide compound (BMI-2300, 30 parts by mass) were dissolved in dimethylacetamide, and were reacted at 150° C. under stirring to prepare BT resin G2.

[Components Used in Examples and Comparative Examples]

The following components were used in Examples and Comparative Examples:
Epoxy Silicone Resin (A)
  Epoxy silicone resin A1: epoxy silicone resin prepared in Synthesis Example 1 (epoxy equivalent: 298 g/eq., viscosity at room temperature (25° C.): 4.8 Pa·s)
  Epoxy silicone resin A2: epoxy silicone resin prepared in Synthesis Example 2 (epoxy equivalent: 249 g/eq., softening point: 55° C., viscosity at 150° C.: 0.37 Pa·s)
Cyanic Acid Ester Compound (B)
  Cyanic acid ester compound B1: cyanic acid ester compound prepared in Synthesis Example 3 (cyanate equivalent: 261 g/eq.)
  Cyanic acid ester compound B2: prepolymer of 2,2-bis(4-cyanatephenyl)propane (CA210, available from MITSUBISHI GAS CHEMICAL COMPANY, INC., cyanate equivalent: 139 g/eq.)
  Cyanic acid ester compound B3: novolac-based cyanic acid ester compound where $R^7$ in formula (7) all is hydrogen atoms (Primaset (registered trademark) PT-30, available from Lonza Japan Ltd., cyanate equivalent: 124 g/eq.)
Phenol Resin (C)
  Phenol resin C1: naphthalene-based phenol resin (EPICLON EXB-9500, available from DIC Corporation, hydroxyl group equivalent: 153 g/eq.)
  Phenol resin C2: biphenylaralkyl-based phenol resin where $R^9$ in formula (9) all is hydrogen atoms (KAYAHARD (registered trademark) GPH-103, available from NIPPON KAYAKU Co., Ltd., hydroxyl group equivalent: 231 g/eq.)
  Phenol resin C3: naphtholaralkyl-based phenol resin where $R^8$ in formula (8) all is hydrogen atoms (SN-495, available from NIPPON STEEL & SUMIKIN CHEMICAL CO., LTD., hydroxyl group equivalent: 236 g/eq.)
  Phenol resin C4: aminotriazine novolac-based phenol resin (PHENOLITE LA-3018-50P, available from DIC Corporation, hydroxyl group equivalent: 151 g/eq.)
Inorganic Filler (D)
  Inorganic filler D1: spherical fused silica (SC2500-SQ, particle size: 0.5 μm, available from Admatechs Company Limited)
Halogen-Free Epoxy Resin (E)
  Halogen-free epoxy resin E1: phenol biphenylaralkyl-based epoxy resin where $R^{11}$ in formula (11) all is hydrogen atoms (NC-3000-FH, available from NIPPON KAYAKU Co., Ltd., epoxy equivalent: 320 g/eq.)
  Halogen-free epoxy resin E2: polyoxynaphthylene-based epoxy resin (HP-6000, available from DIC Corporation, epoxy equivalent: 250 g/eq.)
  Halogen-free epoxy resin E3: phenol phenyl aralkyl novolac-based epoxy resin where $R^{10}$ in formula (10) all is hydrogen atoms (NC-2000-L, available from NIPPON KAYAKU Co., Ltd., epoxy equivalent: 226 g/eq.)
Maleimide Compound (F)
  Maleimide compound F1: maleimide compound where $R^{15}$ in formula (16) all is hydrogen atoms and n is 2 to 3 (BMI-2300, available from Daiwakasei Industry Co., Ltd.)
  Maleimide compound F2: bis(3-ethyl-5-methyl-4-maleimidephenyl)methane (BMI-70, available from K-I Chemical Industry Co., Ltd.)
BT Resin (G)
  BT resin G1: BT resin prepared in Synthesis Example 4
  BT resin G2: BT resin prepared in Synthesis Example 5
Imidazole Compound (H)
  Imidazole compound H1: 2-ethyl-4-methylimidazole (2E4MZ, available from SHIKOKU CHEMICALS CORPORATION)
  Imidazole compound H2: 2,4,5-triphenylimidazole wherein $R^{16}$ and Ar in formula (17) are phenyl groups (available from Wako Pure Chemical Industries, Ltd.)
Silane Coupling Agent
  Silane coupling agent I1: Z-6040 (available from Dow Corning Toray Co., Ltd., epoxy silane coupling agent)
Wet Dispersant
  Wet dispersant J1 (Disperbyk (registered trademark)-161, available from BYK Japan K.K.)
  Wet dispersant J2 (Disperbyk (registered trademark)-111, available from BYK Japan K.K.)
Silicone Powder
  Silicone powder K1: silicone rubber powder whose surface is coated with a silicone resin (silicone composite powder KMP-600, available from Shin-Etsu Chemical Co., Ltd.)

Example 1

Epoxy silicone resin A1 prepared in Synthesis Example 1 (17 parts by mass), the phenol biphenylaralkyl-based epoxy resin where $R^{11}$ in formula (11) all was hydrogen atoms (NC-3000-FH, epoxy equivalent: 320 g/eq., available from NIPPON KAYAKU Co., Ltd., 32 parts by mass), the naphtholaralkyl-based phenol resin where $R^8$ in formula (8) all was hydrogen atoms (SN-495, available from NIPPON STEEL & SUMIKIN CHEMICAL CO., LTD., hydroxyl group equivalent: 236 g/eq., 36 parts by mass), bis(3-ethyl-5-methyl-4-maleimidephenyl)methane (BMI-70, available from K-I Chemical Industry Co., Ltd., 15 parts by mass), the silane coupling agent (available from Dow Corning Toray Co., Ltd., 5 parts by mass), Wet dispersant 1 (Disperbyk (registered trademark)-161, available from BYK Japan K.K., 1 part by mass), spherical fused silica (SC2500-SQ, particle size: 0.5 μm, available from Admatechs Company Limited, 150 parts by mass), and 2-ethyl-4-methylimidazole (2E4MZ, available from SHIKOKU CHEMICALS CORPORATION, 0.02 parts by mass) were mixed to prepare a varnish. The varnish was diluted with methyl ethyl ketone, and was applied to a T-glass woven fabric having a thickness of 0.1 mm by impregnation. The fabric was dried by heating at 140° C. for 3 minutes to prepare a prepreg having a resin content of 46% by mass.

Example 2

Epoxy silicone resin A1 prepared in Synthesis Example 1 (17 parts by mass), a polyoxynaphthylene-based epoxy resin (HP-6000) (27 parts by mass), the biphenylaralkyl-based phenol resin where $R^9$ in formula (9) all was hydrogen atoms (KAYAHARD (registered trademark) GPH-103, available from NIPPON KAYAKU Co., Ltd., hydroxyl group equivalent: 231 g/eq., 18 parts by mass), a naphthalene-based phenol resin (EPICLON EXB-9500, available from DIC Corporation, hydroxyl group equivalent: 153 g/eq., 18 parts by mass), an aminotriazine novolac resin (PHENOLITE LA-3018-50P, hydroxyl group equivalent: 151 g/eq., available from DIC Corporation, 3 parts by mass), bis(3-ethyl-5-methyl-4-maleimidephenyl)methane (BMI-70) (17 parts by mass), a silane coupling agent (Z6040, available from Dow Corning Toray Co., Ltd., 5 parts by mass), and Wet dispersant 1 (Disperbyk (registered trademark)-161, 1 part by mass), spherical fused silica (SC2500-SQ, 150 parts by mass), and imidazole (2E4MZ, available from SHIKOKU CHEMICALS CORPORATION, 0.02 parts by mass) were mixed to prepare a varnish. The varnish was diluted with methyl ethyl ketone, and was applied to a T-glass woven fabric having a thickness of 0.1 mm by impregnation. The fabric was dried by heating at 140° C. for 3 minutes to prepare a prepreg having a resin content of 46% by mass.

Example 3

A prepreg was prepared in the same manner as in Example 2 except that Epoxy silicone resin A1 was replaced with Epoxy silicone resin A2 prepared in Synthesis Example 2 (17 parts by mass).

Example 4

A prepreg was prepared in the same manner as in Example 2 except that bis(3-ethyl-5-methyl-4-maleimidephenyl)methane (BMI-70) was replaced with a maleimide compound (BMI-2300, 17 parts by mass).

Example 5

Epoxy silicone resin A1 (17 parts by mass), a polyoxynaphthylene-based epoxy resin (HP-6000) (43 parts by mass), the α-naphtholaralkyl-based cyanic acid ester resin prepared in Synthesis Example 3 (cyanate equivalent: 261 g/eq., 40 parts by mass), a silane coupling agent (Z6040, 5 parts by mass), Wet dispersant 1 (Disperbyk (registered trademark)-161, 1 part by mass), Wet dispersant 2 (Disperbyk (registered trademark)-111, available from BYK Japan K.K., 2 parts by mass), and spherical fused silica (SC2500-SQ, 200 parts by mass) were mixed to prepare a varnish. The varnish was diluted with methyl ethyl ketone, and was applied to a T-glass woven fabric having a thickness of 0.1 mm by impregnation. The fabric was dried by heating at 140° C. for 3 minutes to prepare a prepreg having a resin content of 46% by mass.

Example 6

A prepreg was prepared in the same manner as in Example 5 except that the α-naphtholaralkyl-based cyanic acid ester resin was replaced with the prepolymer of 2,2-bis(4-cyanate phenyl)propane (CA210, cyanate equivalent: 139, available from MITSUBISHI GAS CHEMICAL COMPANY, INC., 40 parts by mass).

Example 7

A prepreg was prepared in the same manner as in Example 5 except that the α-naphtholaralkyl-based cyanic acid ester resin was replaced with novolac-based cyanic acid ester resin where $R^7$ in formula (7) all was hydrogen atoms (PrimasetPT-30, available from Lonza Japan Ltd., cyanate equivalent: 124 g/eq., 40 parts by mass).

Example 8

Epoxy silicone resin A1 used in Example 1 (17 parts by mass), a polyoxynaphthylene-based epoxy resin (HP-6000, 21 parts by mass), α-naphtholaralkyl-based cyanic acid ester resin prepared in Synthesis Example 3 (cyanate equivalent: 261 g/eq., 36 parts by mass), a maleimide compound (BMI-2300, 26 parts by mass), a silane coupling agent (Z6040, 5 parts by mass), Wet dispersant 1 (Disperbyk (registered trademark)-161, 1 part by mass), Wet dispersant 2 (Disperbyk (registered trademark)-111, 2 parts by mass), spherical fused silica (SC2500-SQ, 180 parts by mass), silicone rubber powder whose surface was coated with a silicone resin (silicone composite powder KMP-600, available from Shin-Etsu Chemical Co., Ltd., 25 parts by mass) were mixed to prepare a varnish. The varnish was diluted with methyl ethyl ketone, and was applied to a T-glass woven fabric having a thickness of 0.1 mm by impregnation. The fabric was dried by heating at 140° C. for 3 minutes to prepare a prepreg having a resin content of 46% by mass.

Example 9

Epoxy silicone resin A1 used in Example 1 (17 parts by mass), a polyoxynaphthylene-based epoxy resin (HP-6000, 21 parts by mass), the α-naphtholaralkyl-based cyanic acid ester resin prepared in Synthesis Example 3 (cyanate equivalent: 261 g/eq., 36 parts by mass), a maleimide compound (BMI-2300, 26 parts by mass), a silane coupling agent (Z6040, 5 parts by mass), Wet dispersant 1 (Disperbyk-161, 1 part by mass), Wet dispersant 2 (Disperbyk-111, 2 parts by mass), spherical fused silica (SC2500-SQ, 200 parts by mass), and 2,4,5-triphenylimidazole wherein $R^{16}$ and Ar in formula (17) were phenyl groups (available from Wako Pure Chemical Industries, Ltd., 1 part by mass) were mixed to prepare a varnish. The varnish was diluted with methyl ethyl ketone, and was applied to a T-glass woven fabric having a thickness of 0.1 mm by impregnation. The fabric was dried by heating at 140° C. for 3 minutes to prepare a prepreg having a resin content of 46% by mass.

Example 10

A prepreg was prepared in the same manner as in Example 9 except that the maleimide compound (BMI-2300) was replaced with bis(3-ethyl-5-methyl-4-maleimidephenyl)methane (BMI-70) (26 parts by mass).

Example 11

A prepreg was prepared in the same manner as in Example 9 except that Epoxy silicone resin A1 (10 parts by mass) and a polyoxynaphthylene-based epoxy resin (HP-6000, 28 parts by mass) were used.

Example 12

A prepreg was prepared in the same manner as in Example 9 except that Epoxy silicone resin A1 (20 parts by mass) and a polyoxynaphthylene-based epoxy resin (HP-6000, 18 parts by mass) were used.

Example 13

A prepreg was prepared in the same manner as in Example 9 except that the polyoxynaphthylene-based epoxy resin was replaced with the phenol biphenylaralkyl-based epoxy resin used in Example 1 (NC-3000-FH) (21 parts by mass).

Example 14

A prepreg was prepared in the same manner as in Example 13 except that Epoxy silicone resin A1 was replaced with Epoxy silicone resin A2 prepared in Synthesis Example 2 (17 parts by mass).

Example 15

A prepreg was prepared in the same manner as in Example 9 except that the polyoxynaphthylene-based epoxy resin was replaced with a phenol phenyl aralkyl novolac-based epoxy resin where $R^{10}$ in formula (10) all was hydrogen atoms (NC-2000-L, epoxy equivalent: 226 g/eq., available from NIPPON KAYAKU Co., Ltd., 21 parts by mass).

Example 16

A prepreg was prepared in the same manner as in Example 9 except that 2-ethyl-4-methylimidazole (2E4MZ, 0.01 parts by mass) was additionally added.

Example 17

A prepreg was prepared in the same manner as in Example 16 except that Epoxy silicone resin A1 was replaced with Epoxy silicone resin A2 prepared in Synthesis Example 2 (17 parts by mass).

Example 18

A prepreg was prepared in the same manner as in Example 9 except that the α-naphtholaralkyl-based cyanic acid ester resin prepared in Synthesis Example 3 (cyanate equivalent: 261 g/eq., 18 parts by mass) and a maleimide compound (BMI-2300, 13 parts by mass) were used, and BT resin G1 prepared in Synthesis Example 4 (BT resin, 31 parts by mass) was added.

Example 19

A prepreg was prepared in the same manner as in Example 9 except that the α-naphtholaralkyl-based cyanic acid ester resin prepared in Synthesis Example 3 and the maleimide compound were not used, and BT resin G1 prepared in Synthesis Example 4 (62 parts by mass) was used.

Example 2.0

A pregreg was prepared in the same manner as in Example 19 except that Epoxy silicone resin A1 was replaced with Epoxy silicone resin A2 prepared in Synthesis Example 2 (17 parts by mass).

Example 21

A prepreg was prepared in the same manner as in Example 9 except that the α-naphtholaralkyl-based cyanic acid ester resin prepared in Synthesis Example 3 and the maleimide compound were not used, and BT resin G2 prepared in Synthesis Example 5 (62 parts by mass) was used.

Example 22

A prepreg was prepared in the same manner as in Example 21 except that Epoxy silicone resin A1 was replaced with Epoxy silicone resin A2 prepared in Synthesis Example 2 (17 parts by mass).

Example 23

A prepreg was prepared in the same manner as in Example 19 except that BT resin G1 prepared in Synthesis Example 4 (59 parts by mass) was used and a naphtholaralkyl-based phenol resin (SN-495, 3 parts by mass) was additionally used.

Example 24

A prepreg was prepared in the same manner as in Example 8 except that a polyoxynaphthylene-based epoxy resin (HP-6000, 19 parts by mass), the α-naphtholaralkyl-based cyanic acid ester resin (cyanate equivalent: 261 g/eq., 32 parts by mass), a maleimide compound (BMI-2300, 32 parts by mass), Wet dispersant 2 (Disperbyk (registered trademark)-111, 3 parts by mass), spherical fused silica (SC2500-SQ, 250 parts by mass), and silicone rubber powder whose surface was coated with a silicone resin (silicone composite powder KMP-600, 50 parts by mass) were used.

Example 25

A prepreg was prepared in the same manner as in Example 24 except that Epoxy silicone resin A1 was replaced with Epoxy silicone resin A2 prepared in Synthesis Example 2 (17 parts by mass).

Example 26

A prepreg was prepared in the same manner as in Example 4 except that the T-glass woven fabric was replaced with a Q-glass woven fabric having a thickness of 0.1 mm in the application by impregnation.

Example 27

A prepreg was prepared in the same manner as in Example 4 except that the E-glass woven fabric was replaced with an organic woven fabric (Technora, available from Teijin Techno Products Limited) in the application by impregnation.

Example 28

A prepreg was prepared in the same manner as in Example 24 except that the T-glass woven fabric was replaced with a Q-glass woven fabric having a thickness of 0.1 mm in the application by impregnation.

Example 29

A prepreg was prepared in the same manner as in Example 24 except that the E-glass woven fabric was replaced with an organic woven fabric (Technora, available from Teijin Techno Products Limited) in the application by impregnation.

Comparative Example 1

A prepreg was prepared in the same manner as in Example 2 except that Epoxy silicone resin A1 was not used and the amount of the polyoxynaphthylene-based epoxy resin (HP-6000) was changed to 44 parts by mass.

Comparative Example 2

A prepreg was prepared in the same manner as in Example 11 except that Epoxy silicone resin A1 was not used and the amount of the polyoxynaphthylene-based epoxy resin (HP-6000) was changed to 38 parts by mass.

Comparative Example 3

A pregreg was prepared in the same manner as in Example 19 except that Epoxy silicone resin A1 was not used and the amount of the polyoxynaphthylene-based epoxy resin (HP-6000) was changed to 38 parts by mass.

Comparative Example 4

A prepreg was prepared in the same manner as in Example 21 except that Epoxy silicone resin A2 was not used and the amount of the polyoxynaphthylene-based epoxy resin (HP-6000) was changed to 38 parts by mass.

Comparative Example 5

A prepreg was prepared in the same manner as in Comparative Example 1 except that the amount of spherical fused silica was changed to 250 parts by mass.

[Preparation of Metal Foil Clad Laminate]

Two prepregs prepared in each of Examples 1 to 29 and Comparative Examples 1 to 5 were layered, and electrodeposited copper foils having a thickness of 12 μm (3EC-III, available from Mitsui Mining & Smelting Co., Ltd.) each were disposed on and under the layered prepregs. The layered product was lamination molded at a pressure of 30 kgf/cm$^2$ and a temperature of 220° C. for 120 minutes to prepare Copper clad laminate 1 including an insulating layer having a thickness of 0.2 mm.

Copper clad laminates 1 thus prepared were evaluated on molding properties, heat resistance, and the coefficient of thermal expansion in the planar direction by the following methods, and the results are shown in Tables 1 and 2.

Four prepregs prepared in each of Examples 1 to 3 and Comparative Examples 1 and 5 were layered, and electrodeposited copper foils having a thickness of 12 μm (3EC-III, available from Mitsui Mining & Smelting Co., Ltd.) each were disposed on and under the layered prepregs. The layered product was lamination molded at a pressure of 30 kgf/cm$^2$ and a temperature of 220° C. for 120 minutes to prepare Copper clad laminate 2 including an insulating layer having a thickness of 0.4 mm.

Copper clad laminates 2 thus prepared were evaluated on drilling processability by the following method, and the results are shown in Table 3.

[Method of Evaluating Physical Properties of Metal Foil Clad Laminate]

The molding properties, the heat resistance, the coefficient of thermal expansion in the planar direction, and the drilling processability were evaluated by the following methods.

(Molding Properties)

The copper foil of the copper clad laminate was removed by etching, and the surface was observed. The molding properties were evaluated based on presence/absence of voids according to the following evaluation criteria:

○: no void
X: voids (Heat Resistance)

The copper clad laminate was floated on solder kept at 260° C. or 288° C., and the time (min) until delamination (separation between layers) occurred was evaluated.

(Coefficient of Thermal Expansion in Planar Direction)

The copper foil of the copper clad laminate was removed by etching, and the copper clad laminate was heated with a thermomechanical analyzer (available from TA Instruments-Waters Corporation LLC) at 10° C./min from 40° C. to 340° C. to measure the coefficient of linear expansion in the planar direction (ppm/° C.) from 60° C. to 120° C. The direction for measurement was the longitudinal direction (Warp) of the glass cloth of the laminate.

TABLE 1

|  | Example 1 | Example 2 | Example 3 | Example 4 | Example 5 | Example 6 | Example 7 | Example 8 |
|---|---|---|---|---|---|---|---|---|
| Molding properties | ○ | ○ | ○ | ○ | ○ | ○ | ○ | ○ |
| Heat resistance 260° C. | >30 | >30 | >30 | >30 | >30 | >30 | >30 | >30 |
| Heat resistance 288° C. | >30 | >30 | >30 | >30 | >30 | >30 | >30 | >30 |
| Coefficient of thermal expansion | 4.8 | 4.9 | 4.9 | 4.8 | 3.6 | 3.8 | 3.7 | 3.1 |

|  | Example 9 | Example 10 | Example 11 | Example 12 | Example 13 | Example 14 | Example 15 | Example 16 |
|---|---|---|---|---|---|---|---|---|
| Molding properties | ○ | ○ | ○ | ○ | ○ | ○ | ○ | ○ |
| Heat resistance 260° C. | >30 | >30 | >30 | >30 | >30 | >30 | >30 | >30 |
| Heat resistance 288° C. | >30 | >30 | >30 | >30 | >30 | >30 | >30 | >30 |
| Coefficient of thermal expansion | 3.6 | 3.7 | 4.2 | 3.3 | 4.0 | 3.9 | 3.9 | 3.7 |

|  | Example 17 | Example 18 | Example 19 | Example 20 | Example 21 | Example 22 | Example 23 | Example 24 |
|---|---|---|---|---|---|---|---|---|
| Molding properties | ○ | ○ | ○ | ○ | ○ | ○ | ○ | ○ |
| Heat resistance 260° C. | >30 | >30 | >30 | >30 | >30 | >30 | >30 | >30 |
| Heat resistance 288° C. | >30 | >30 | >30 | >30 | >30 | >30 | >30 | >30 |
| Coefficient of thermal expansion | 3.7 | 3.5 | 3.7 | 3.7 | 3.6 | 3.9 | 3.5 | 2.8 |

|  | Example 25 | Example 26 | Example 27 | Example 28 | Example 29 |
|---|---|---|---|---|---|
| Molding properties | ○ | ○ | ○ | ○ | ○ |
| Heat resistance 260° C. | >30 | >30 | >30 | >30 | >30 |
| Heat resistance 288° C. | >30 | >30 | >30 | >30 | >30 |
| Coefficient of thermal expansion | 2.7 | 2.4 | 3.1 | 1.7 | 1.5 |

Molding properties ○: no void X: voids
Units heat resistance: min coefficient of thermal expansion: ppm/° C.

TABLE 2

|  | Comparative Example 1 | Comparative Example 2 | Comparative Example 3 | Comparative Example 4 | Comparative Example 5 |
|---|---|---|---|---|---|
| Molding properties | ○ | ○ | ○ | ○ | ○ |
| Heat resistance 260° C. | >30 | >30 | >30 | >30 | >30 |
| Heat resistance 288° C. | >30 | >30 | >30 | >30 | >30 |
| Coefficient of thermal expansion | 6.2 | 6.6 | 5.4 | 5.5 | 4.8 |

Molding properties
○: no void
X: voids
Units
Heat resistance: min
Coefficient of thermal expansion: ppm/° C.

(Drilling Processability)

In Examples 1 to 3 and Comparative Examples 1 and 5, drilling processability was evaluated. The results are shown in Table 3. In the evaluation of drilling processability, the number of hits of drill bit breakage and the accuracy of hole position were evaluated on the following drilling conditions:

(Drilling Conditions)

Drilling machine: available from Hitachi Via Mechanics, Ltd., ND-1 V212

The number of layers: four copper clad laminates

Entry sheet: available from Mitsubishi Gas Chemical Company, Inc., LE400

Backup board: available from RISHO KOGYO CO., LTD., PS-1160D

Drill bit: available from UNION TOOL CO., MD MC 0.18×3.3 L508A)

The number of rotations: 200 krpm

Feeding rate: 2.0 m/min

The number of hit: 3000

TABLE 3

|  | Example 1 | Example 2 | Example 6 | Comparative Example 1 | Comparative Example 5 |
|---|---|---|---|---|---|
| Bit breakage | >3000 | >3000 | >3000 | >3000 | 1426 |
| Accuracy of hole position | 48 | 51 | 49 | 55 | — |

In Table 3, the number of hits of drill bit breakage is obtained by counting the statistical number of holes. The accuracy of hole position is defined as follows: an amount of deviation between the position of a hole and the position of a designated coordinate on the rear surface of the bottom plate of the laminate is measured. The amount of deviation in the position is measured on the total number of drilled holes per one drill. The average value and the standard deviation ($\sigma$) are calculated to calculate the average value +3$\sigma$ of the amount of deviation in the position. The value expressed by 3$\sigma$ is defined as accuracy of hole position.

This application is based on Japanese Patent Application No. 2012-231631, filed with the Japan Patent Office on Oct. 19, 2012, the contents of which are incorporated herein by reference.

INDUSTRIAL APPLICABILITY

The resin composition of the present invention has industrial applicability as a material for a semiconductor plastic package that requires high flame retardancy, a low coefficient of thermal expansion, high heat resistance, high reliability, and high drilling processability.

The invention claimed is:

1. A resin composition, comprising at least
an epoxy silicone resin (A) prepared by reacting a linear polysiloxane (a) having a hemiester group with a cyclic epoxy compound (b) having an epoxy group such that the epoxy group of the cyclic epoxy compound (b) is 2 to 10 equivalents based on the hemiester group of the linear polysiloxane (a),
a cyanic acid ester compound (B) and/or a phenol resin (C), and
an inorganic filler (D).

2. The resin composition according to claim 1, further comprising a halogen-free epoxy resin (E).

3. The resin composition according to claim 1, further comprising a maleimide compound (F).

4. The resin composition according to claim 1, comprising a cyanic acid ester compound (B) that comprises one or more selected from the group consisting of naphtholaralkyl-based cyanic acid ester compounds represented by formula (6):

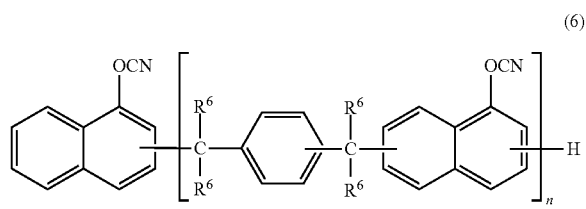

wherein $R^6$ each independently represents a hydrogen atom or a methyl group, and n represents an integer of 1 or more;

and novolac-based cyanic acid ester compounds represented by formula (7):

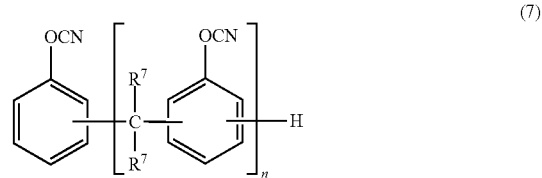

wherein $R^7$ each independently represents a hydrogen atom or a methyl group, and n represents an integer of 1 or more.

5. The resin composition according to claim 1, comprising a phenol resin (C) that comprises one or more selected from the group consisting of naphtholaralkyl-based phenol resins represented by formula (8):

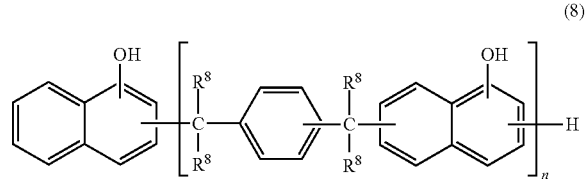

wherein $R^8$ each independently represents a hydrogen atom or a methyl group, and n represents an integer of 1 or more;

and biphenylaralkyl-based phenol resins represented by formula (9):

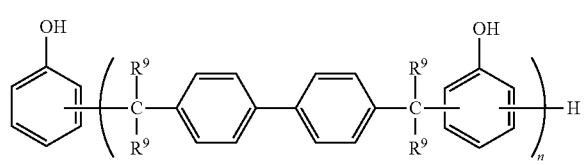

wherein R⁹ each independently represents a hydrogen atom or a methyl group, and n represents an integer of 1 or more.

6. The resin composition according to claim 3, wherein the maleimide compound (F) comprises a maleimide compound represented by formula (16):

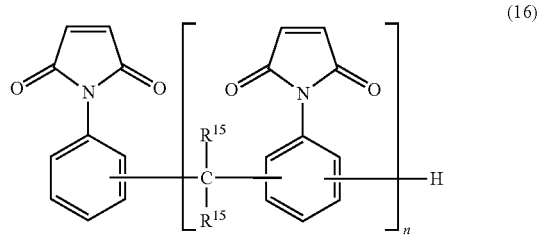

wherein R¹⁵ each independently represents a hydrogen atom or a methyl group, and n represents an integer of 1 or more.

7. The resin composition according to claim 3, wherein a content of the epoxy silicone resin (A) is 5 to 50 parts by mass based on 100 parts by mass of a total content of the epoxy silicone resin (A), the cyanic acid ester compound (B), the phenol resin (C), the halogen-free epoxy resin (E), and the maleimide compound (F).

8. The resin composition according to claim 3, wherein a total content of the cyanic acid ester compound (B) and the phenol resin (C) is 10 to 50 parts by mass based on 100 parts by mass of the total content of the epoxy silicone resin (A), the cyanic acid ester compound (B), the phenol resin (C), the halogen-free epoxy resin (E), and the maleimide compound (F).

9. The resin composition according to claim 3, wherein a content of the inorganic filler (D) is 50 to 400 parts by mass based on 100 parts by mass of the total content of the epoxy silicone resin (A), the cyanic acid ester compound (B), the phenol resin (C), the halogen-free epoxy resin (E), and the maleimide compound (F).

10. The resin composition according to claim 3, wherein a content of the maleimide compound (F) is 3 to 50 parts by mass based on 100 parts by mass of the total content of the epoxy silicone resin (A), the cyanic acid ester compound (B), the phenol resin (C), the halogen-free epoxy resin (E), and the maleimide compound (F).

11. The resin composition according to claim 1, further comprising an imidazole compound (H),
wherein the imidazole compound (H) comprises an imidazole compound represented by formula (17):

wherein Ar each independently represents a phenyl group, a naphthalene group, a biphenyl group, an anthracene group, or a hydroxyl group-modified group thereof, and R¹⁶ represents a hydrogen atom, an alkyl group, a hydroxyl group-modified group of an alkyl group, or an aryl group.

12. The resin composition according to claim 11, wherein the imidazole compound (H) comprises 2,4,5-triphenylimidazole.

13. The resin composition according to claim 1, wherein the inorganic filler (D) comprises one or more selected from the group consisting of boehmite and silicas.

14. The resin composition according to claim 2, wherein the halogen-free epoxy resin (E) is one or more selected from the group consisting of phenol phenyl aralkyl novolac-based epoxy resins, phenol biphenylaralkyl-based epoxy resins, naphtholaralkyl-based epoxy resins, anthraquinone-based epoxy resins, and polyoxynaphthylene-based epoxy resins.

15. A prepreg, comprising a base material, and the resin composition according to claim 1 impregnated into or applied to the base material.

16. The prepreg according to claim 15, wherein the base material is one or more selected from the group consisting of an E-glass cloth, a T-glass cloth, an S-glass cloth, a Q-glass cloth, and organic fibers.

17. A laminate, comprising one or more layers comprising the prepreg according to claim 15.

18. A metal foil clad laminate, comprising the prepreg according to claim 15, and a metallic foil laminated on the prepreg.

19. A printed circuit board, comprising an insulating layer, and a conductive layer disposed on a surface of the insulating layer,
wherein the insulating layer comprises the resin composition according to claim 1.

20. The resin composition according to claim 1, wherein the cyclic epoxy resin (b) comprises an alicyclic compound having an epoxy group, or an isocyanuric ring.

21. The resin composition according to claim 1, comprising a cyanic acid ester compound (B) that comprises one or more selected from the group consisting of naphtholaralkyl-based cyanic acid ester compounds represented by formula (6):

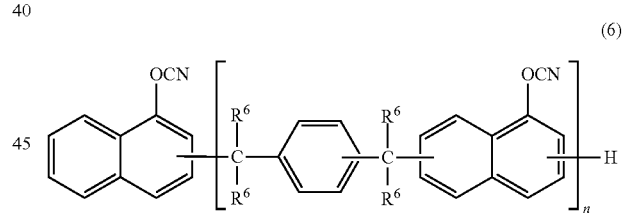

wherein R⁶ each independently represents a hydrogen atom or a methyl group, and n represents an integer of 1 or more;
novolac-based cyanic acid ester compounds represented by formula (7):

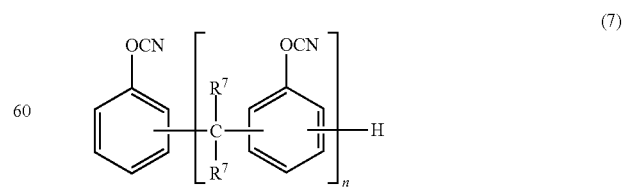

wherein R⁷ each independently represents a hydrogen atom or a methyl group, and n represents an integer of 1 or more;

a phenol resin (C) that comprises one or more selected from the group consisting of naphtholaralkyl-based phenol resins represented by formula (8):

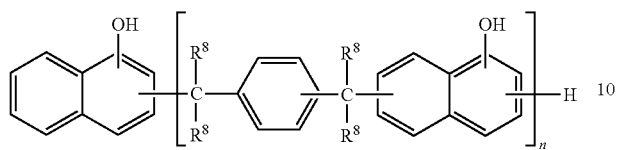

(8)

wherein $R^8$ each independently represents a hydrogen atom or a methyl group, and n represents an integer of 1 or more;

and biphenylaralkyl-based phenol resins represented by formula (9):

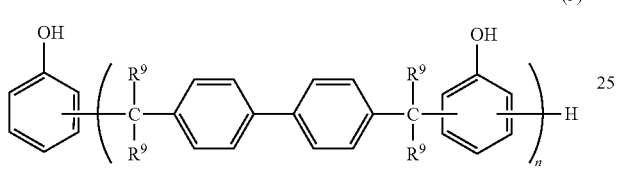

(9)

wherein $R^9$ each independently represents a hydrogen atom or a methyl group, and n represents an integer of 1 or more.

22. A resin composition, comprising at least
an epoxy silicone resin (A) prepared by reacting a linear polysiloxane (a) having a hemiester group with a cyclic epoxy compound (b) having an epoxy group such that the epoxy group of the cyclic epoxy compound (b) is 2 to 10 equivalents based on the hemiester group of the linear polysiloxane (a),
a BT resin (G) prepared by forming a cyanic acid ester compound (B) and a maleimide compound (F) into a prepolymer, and
an inorganic filler (D).

23. The resin composition according to claim 22, further comprising a halogen-free epoxy resin (E).

24. The resin composition according to claim 22, wherein the cyanic acid ester compound (B) comprises one or more selected from the group consisting of naphtholaralkyl-based cyanic acid ester compounds represented by formula (6):

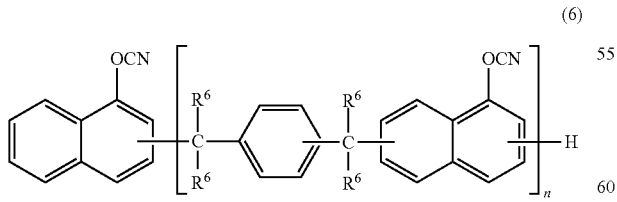

(6)

wherein $R^6$ each independently represents a hydrogen atom or a methyl group, and n represents an integer of 1 or more;

and novolac-based cyanic acid ester compounds represented by formula (7):

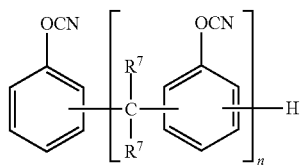

(7)

wherein $R^7$ each independently represents a hydrogen atom or a methyl group, and n represents an integer of 1 or more.

25. The resin composition according to claim 22, wherein the maleimide compound (F) comprises a maleimide compound represented by formula (16):

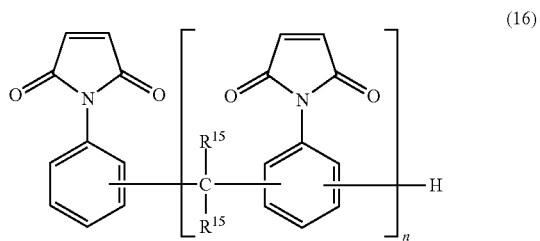

(16)

wherein $R^{15}$ each independently represents a hydrogen atom or a methyl group, and n represents an integer of 1 or more.

26. The resin composition according to claim 23, wherein a content of the epoxy silicone resin (A) is 5 to 50 parts by mass based on 100 parts by mass of a total content of the epoxy silicone resin (A), the BT resin (G), and the halogen-free epoxy resin (E).

27. The resin composition according to claim 23, wherein a content of the BT resin (G) is 20 to 80 parts by mass based on 100 parts by mass of the total content of the epoxy silicone resin (A), the BT resin (G), and the halogen-free epoxy resin (E).

28. The resin composition according to claim 23, wherein a content of the inorganic filler (D) is 50 to 400 parts by mass based on 100 parts by mass of the total content of the epoxy silicone resin (A), the BT resin (G), and the halogen-free epoxy resin (E).

29. The resin composition according to claim 22, further comprising an imidazole compound (H),
wherein the imidazole compound (H) comprises an imidazole compound represented by formula (17):

(17)

wherein Ar each independently represents a phenyl group, a naphthalene group, a biphenyl group, an anthracene group, or a hydroxyl group-modified group thereof, and R16 represents a hydrogen atom, an alkyl group, a hydroxyl group-modified group of an alkyl group, or an aryl group.

30. The resin composition according to claim 29, wherein the imidazole compound (H) comprises 2,4,5-triphenylimidazole.

31. The resin composition according to claim 22, wherein the inorganic filler (D) comprises one or more selected from the group consisting of boehmite and silicas.

32. The resin composition according to claim 23, wherein the halogen-free epoxy resin (E) is one or more selected from the group consisting of phenol phenyl aralkyl novolac-based epoxy resins, phenol biphenylaralkyl-based epoxy resins, naphtholaralkyl-based epoxy resins, anthraquinone-based epoxy resins, and polyoxynaphthylene-based epoxy resins.

33. A prepreg, comprising a base material, and the resin composition according to claim 22 impregnated into or applied to the base material.

34. The prepreg according to claim 33, wherein the base material is one or more selected from the group consisting of an E-glass cloth, a T-glass cloth, an S-glass cloth, a Q-glass cloth, and organic fibers.

35. A laminate, comprising one or more layers comprising the prepreg according to claim 33.

36. A metal foil clad laminate, comprising the prepreg according to claim 33, and a metallic foil laminated on the prepreg.

37. A printed circuit board, comprising an insulating layer, and a conductive layer disposed on a surface of the insulating layer, wherein the insulating layer comprises the resin composition according to claim 22.

38. The resin composition according to claim 22, wherein the cyclic epoxy resin (b) comprises an alicyclic compound having an epoxy group, or an isocyanuric ring.

* * * * *

UNITED STATES PATENT AND TRADEMARK OFFICE
CERTIFICATE OF CORRECTION

PATENT NO.       : 10,030,141 B2
APPLICATION NO.  : 14/435574
DATED            : July 24, 2018
INVENTOR(S)      : Tomo Chiba et al.

It is certified that error appears in the above-identified patent and that said Letters Patent is hereby corrected as shown below:

On the Title Page

Item (75) change "Chiba-ken, JAPAN" to -- Tokyo, JAPAN --.

Signed and Sealed this
Ninth Day of April, 2019

Andrei Iancu
*Director of the United States Patent and Trademark Office*